United States Patent [19]

Dolikian et al.

[11] Patent Number: 4,627,098

[45] Date of Patent: Dec. 2, 1986

[54] AUTOMATIC GAIN CONTROL FOR A REMOTE CONTROL SYSTEM HAVING SYMMETRICAL SEND/RECEIVE SIGNALING CIRCUITS

[75] Inventors: Arman V. Dolikian, Palatine; Michael D. Kotzin, Buffalo Grove; Brian J. Budnik, Schaumburg, all of Ill.

[73] Assignee: Motorola, Inc., Schaumburg, Ill.

[21] Appl. No.: 797,722

[22] Filed: Nov. 13, 1985

Related U.S. Application Data

[62] Division of Ser. No. 568,170, Jan. 4, 1984.

[51] Int. Cl.$^4$ .................. H04B 1/00; H04B 7/00; H03G 3/20
[52] U.S. Cl. .................... 455/70; 455/244; 340/825.48; 330/86; 330/281; 330/282; 379/58; 379/102
[58] Field of Search ............ 455/54, 56, 58, 68, 455/70, 242–244; 179/2 A, 2 AM, 2 DP, 2.51, 37, 84 VF, 170.4; 370/76, 110.1, 124; 340/825.48, 825.73, 825.76; 330/86, 282, 280, 281, 138, 141

[56] References Cited

U.S. PATENT DOCUMENTS

| | | |
|---|---|---|
| 2,401,024 | 5/1946 | Sateren . |
| 3,335,227 | 8/1967 | Jackel . |
| 3,383,467 | 5/1968 | New et al. . |
| 3,402,360 | 9/1968 | Millon . |
| 3,436,487 | 4/1969 | Blane . |
| 3,679,986 | 7/1972 | Zaman, III ........................... 330/86 |
| 4,030,034 | 6/1977 | Ruegg ............................... 330/86 |
| 4,034,296 | 7/1977 | Berenson et al. . |
| 4,052,678 | 10/1977 | Ramsland . |
| 4,115,741 | 9/1978 | Skutta . |
| 4,131,849 | 12/1978 | Freeburg et al. . |
| 4,147,900 | 4/1979 | Gaetano et al. ..................... 330/138 |
| 4,160,873 | 7/1979 | Beseke et al. . |
| 4,184,118 | 1/1980 | Cannalte et al. . |
| 4,334,185 | 6/1982 | Turney et al. . |

FOREIGN PATENT DOCUMENTS

| | | | |
|---|---|---|---|
| 2940078 | 4/1981 | Fed. Rep. of Germany ....... 330/282 |
| 0026145 | 2/1977 | Japan .................................. 330/86 |
| 0062413 | 5/1981 | Japan .................................. 330/281 |
| 0169408 | 12/1981 | Japan ................................. 330/86 |

OTHER PUBLICATIONS

"Photocoupler Provides AGC for Audio Communications"—Dickey, Electronics—Jan. 22, 1976, pp. 97, 99.
"Fast DC Amplifier with Autoranging over Six Decades"—Lasser et al., Nuclear Instruments and Methods 101, No. 3, 1972, pp. 527–534, North-Holland Publishing Co.
Siliconix, Inc., "FET Design Catalog", 1979, pp. 6-39 to 6-47.

*Primary Examiner*—Jin F. Ng
*Attorney, Agent, or Firm*—Donald B. Southard; Raymond A. Jenski

[57] ABSTRACT

The remote control system having symmetrical signaling circuits for radio communications is coupled to a single wire line/audio channel and permits two or more units, base stations and/or remote consoles, to be coupled to the single wire line. Each signaling circuit comprises a wire line coupler for coupling to the wire line, an audio input line and an audio output line. An automatic gain control circuit is coupled between the wire coupler and the audio output line and a filter and line driver are coupled between the audio input line and the wire coupler. A control unit including a microprocessor, a tone encoder, a tone decoder, a timer, a clock, and a memory is coupled by output lines to the automatic gain control circuit for controlling the modes of operation thereof which include a slow decay mode, a fast decay mode, an adapt mode and a hold gain mode. The output from the gain control circuit is also routed through a band pass filter and a limiter to the control unit. Further, the tone encoder of the control unit is coupled to a summing circuit situated between the filter and line driver through a filter and level control circuit.

The protocol programmed in the microprocessor enables any unit to take control of the audio channel by initiating the sending of a message. Also mute gates are provided for disabling audio output or audio input while a message is being sent or received over the audio channel.

26 Claims, 14 Drawing Figures

MAJOR ELEMENTS OF SIGNALLING CIRCUIT
BASE STATION

MAJOR ELEMENTS OF SIGNALLING CIRCUIT HARDWARE
REMOTE CONSOLE

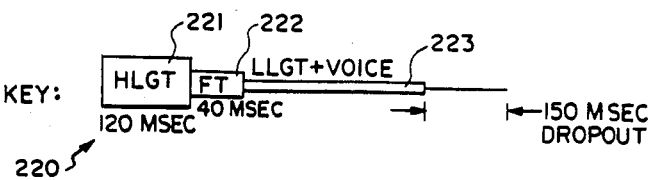

FIG. 5
PRIOR ART
SIMPLE STATION KEY:

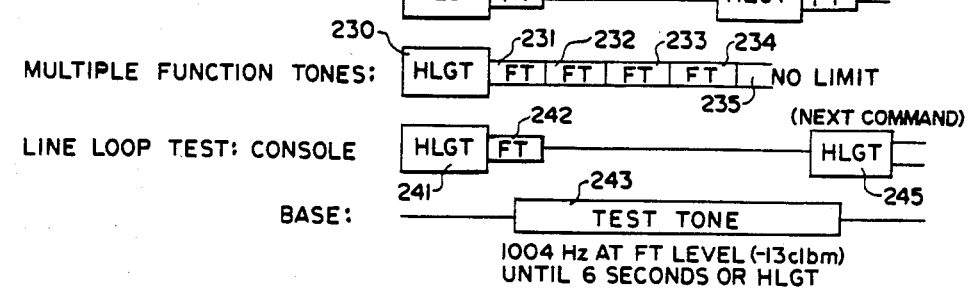

FIG. 6
"PIGGY-BACK" STATION KEY:

MULTIPLE FUNCTION TONES:

LINE LOOP TEST: CONSOLE

BASE:

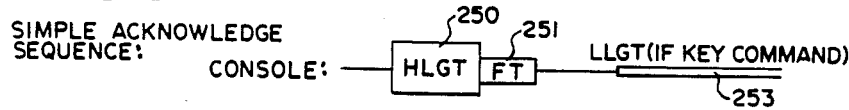

FIG 7
SIMPLE ACKNOWLEDGE SEQUENCE:
CONSOLE:

BASE:

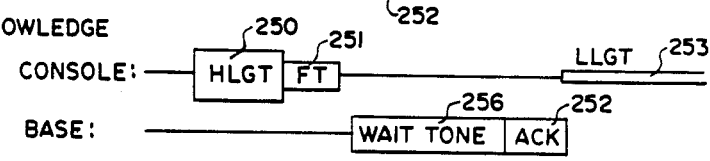

VERIFIED ACKNOWLEDGE SEQUENCE:
CONSOLE:

BASE:

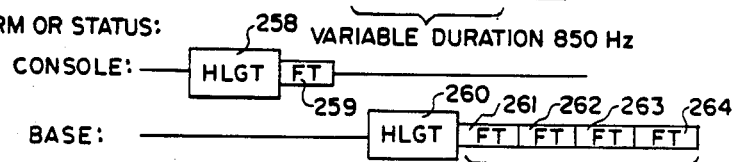

SOLICITED ALARM OR STATUS:
CONSOLE:

BASE:

UNSOLICITED ALARMS
SAME AS ABOVE EXCEPT BASE SENDS AUTOMATICALLY

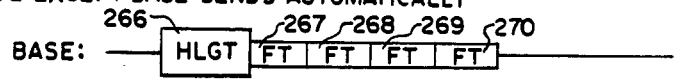

BASE:

CONSOLE:

LEADING STATUS MESSAGE:
BASE:

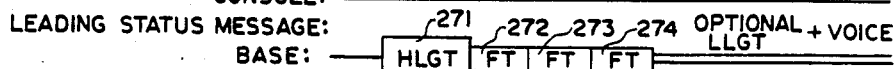

TRAILING STATUS MESSAGE:
BASE:

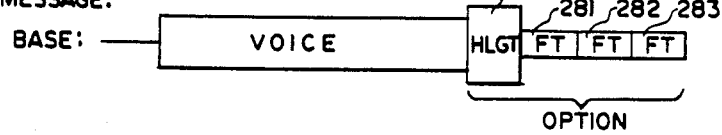

FIG. 8

FUNCTION TONES USED:

| TONE NO. | NOMINAL FREQ. | USE | | |
|---|---|---|---|---|
| F0 | 2175 Hz | HIGH LEVEL/LOW LEVEL GUARD TONE | | |
| F1 | 2050 Hz | STANDARD FUNCTION TONE | | |
| F2 | 1950 Hz | " | " | " |
| F3 | 1850 Hz | " | " | " |
| F4 | 1750 Hz | " | " | "/DATA TONE 000 |
| F5 | 1650 Hz | " | " | "/DATA TONE 001 |
| F6 | 1550 Hz | " | " | "/DATA TONE 010 |
| F7 | 1450 Hz | " | " | "/DATA TONE 011 |
| F8 | 1350 Hz | " | " | "/DATA TONE 100 |
| F9 | 1250 Hz | " | " | "/DATA TONE 101 |
| F10 | 1150 Hz | " | " | "/DATA TONE 110 |
| F11 | 1050 Hz | " | " | "/DATA TONE 111 |
| F12 | 950 Hz | " | " | "/REPEAT TONE/ACC TONE |
| F13 | 850 Hz | " | " | "/WAIT TONE |
| F14 | 750 Hz | " | " | " |
| F15 | 650 Hz | " | " | " |

EQUIVALENT CIRCUIT

NOTE: HIGH PRIORITY MESSAGE COULD BE SENT HERE, USING THE DECODER'S HIGH LEVEL GUARD TONE CAPTURE FEATURE. SIMPLY SEND MESSAGE ANY TIME AFTER LLGT IS DROPPED.

AUTOMATIC GAIN CONTROL FOR A REMOTE CONTROL SYSTEM HAVING SYMMETRICAL SEND/RECEIVE SIGNALING CIRCUITS

This is a division of application Ser. No. 568,170, filed Jan. 4, 1984.

CROSS REFERENCE TO RELATED APPLICATIONS

This application is related to U.S. patent application Ser. No. 412,628 filed on Aug. 30, 1982, now U.S. Pat. No. 4,455,617, entitled: Multiple Simultaneous Tone Decoder, U.S. patent application Ser. No. 448,457 filed on Dec. 10, 1982, now U.S. Pat. No. 4,554,542, and entitled: Guard Tone Capture Method and U.S. patent application Ser. No. 487,4902 filed on Apr. 22, 1983 now abandoned, and entitled Paging Universal Remote Control Encoder.

BACKGROUND OF THE INVENTION

1. Field of the Invention

The present invention relates to a tone and voice shared remote control system for radio communications and more particularly to an automatic gain control circuit for use in a symmetrical signaling circuit in each unit of the remote control system for controlling the operation of one or more additional units of the system, all of which are coupled to a single audio channel.

2. Description of the Prior Art

Heretofore, various remote control systems for enabling a remote console to control a base station coupled to a transmitter and receiver have been proposed. Examples of several of these systems are disclosed in the following U.S. patents:

| U.S. PAT. NO. | PATENTEE |
| --- | --- |
| 3,577,080 | Cannalte |
| 4,184,118 | Cannalte et al |
| 4,208,631 | Beseke et al |

The system for remote control of a base station disclosed in U.S. Pat. No. 3,577,080 utilizes tone controls which are supplied over wire lines. A variety of different tone controls can be generated and transmitted over the wire lines to control various functions of the base station. This system is limited by the fact that signaling is initiated strictly from the remote control console (point of control) for commanding the execution of functions at the base station.

The base station feedback reporting system disclosed in U.S. Pat. No. 4,184,118 is an improvement over the previous remote control system and includes a tone control system that allows for acknowledgement from the base station of the function command received from the remote console. In this way system reliability is improved by indicating functional line interconnection and communication by the remote console with the base station.

U.S. Pat. No. 4,208,631 discloses a digital pulsed DC remote control system. This system utilizes digital pulsed DC signaling to select a radio channel of a base station transmitter for transmission of a message and does not utilize tones as does the system of the present invention.

There has also been proposed in U.S. Pat. No. 4,209,131 a computer-controlled irrigation system where remote sensors and fluid delivery systems are controlled by a central control station having a computer and interface circuits.

In the systems disclosed in the patents referred to above, the number of tone command functions is greatly limited. Furthermore, function commands are restricted to tone transmission from the control point to the base station and not vice versa.

Still further, the protocol in these prior systems for data transfer is not expandable and incapable of transferring great amounts of data information between the remote consoles and base stations.

Moreover, in the systems disclosed in the Cannalte patents, the signaling times are fixed. In particular, the windows for function tones can be opened for fixed periods of time to receive one or more function tones. This situation fosters low reliability due to falsing from noise signals or voice signals. Additionally, there exists no method in these prior systems for a remote console to determine the latched state of a base station without initiating a function change to a given known state.

Furthermore, in these prior systems there is no mechanism for a base station to initiate an unsolicited data transmission or an interrupt alarm signal or a status signal to a remote console.

Also, in the prior systems, multiple remote consoles and multiple base stations cannot be accomodated or coupled to a common audio channel or wire line while still maintaining uniform positive system integrity, knowledge of system state by all remote consoles and base stations and inherent muting of data sequences on parallel control positions.

As will be described in greater detail hereinafter, the remote control system having voice shared, tone, symmetrical, signaling circuits for radio communications of the present invention differs from the previously proposed systems by including one or more remote consoles and/or one or more base stations coupled to a single common wire line/audio channel. Each base station and remote console having a symmetrical signaling circuit with a plurality of modes of operation that provide inherent self-diagnostic capability and potential interface to external sources of digital data.

Moreover, in the systems of the present invention, gated sequential tone signaling is time multiplexed and compatible with the audio information to be transferred between units, whether they be base stations and/or remote consoles.

In addition, priority or preference in initiation of signaling over the audio channel or wire line is possible by any remote console or base station. All other units of base stations or remote consoles are responsive to this initiation of signaling in a well defined and predetermined manner by the alteration of internal status states within the control unit of each signaling circuit and possibly by the participating in the data exchange by acknowledge or reply from a receiving signaling circuit.

Still further, the signaling protocol utilized is highly structured to permit a high degree of flexibility and expansion in data interchanges while necessitating minimum degradation in basic system performance such as by the introduction of any delay or interference of normal voice transmission.

SUMMARY OF THE INVENTION

According to the invention there is provided for use in a remote control system for radio communications, a voice shared, tone send/receive signaling circuit comprising audio channel coupling means for sending signals to and receiving signals from an audio channel coupled thereto, gain control and signal coupling means for coupling an output of said audio channel coupling means to an audio output line, audio signal transmission means having an input adapted to be coupled to an audio input line and an output coupled to said audio channel coupling means, and control means for decoding received signals, for encoding transmitted signals, for controlling the send and receive signal transmissions into and out of said signaling circuit, said control means being coupled to the output of said signal coupling means and to said audio signal transmission means, and being operable to decipher coded signals associated with analog voice signals received by said audio channel coupling means and for supplying an encoded signal to said audio signal transmission means to be added to an audio signal supplied to said audio channel coupling means.

Also, according to the invention there is provided in an automatic gain control circuit comprising an operational amplifier, the improvement comprising: a voltage controlled resistor coupled between a minus input and the output of said operational amplifier, a fixed resistor coupled between a signal source and said minus input of said amplifier, and a plus input of said amplifier being coupled to a reference voltage $V_B$.

With the remote control system of the present invention and the symmetrical signaling circuits utilized therein base stations and remote consoles all have equivalent signaling capability. In this respect a base station can "KEY" other base stations or remote consoles and vice versa. The units of the system inherently stay in synchronization since all messages and acknowledgements are monitored and decoded by all parallel connected nodes consisting of one or more remote consoles and/or one or more base stations.

The signaling circuits are programmed to receive reverse alarm reports, unsolicited status reports and wait-for-free-channel reports as well as polled operation. Full cross muting of audio input and output lines to and from each signaling circuit is available during signaling and during unsolicited alarms.

Each unit, base station or remote console is capable of positive, independent select/deselect of a parallel unit preventing loss of a unit by accidentally disabling it. This is useful for transmitter steering and for microwave backbone systems. Audio and function tones are automatically muted during signaling of the other thereby eliminating annoying tones on the audio channel.

Many signaling functions are programmable via a plurality of function tones which can be decoded into binary words.

The protocol for operating the signaling circuits via a microprocessor in each signaling circuit permits upward compatible signaling using standard TRC function tones. However, messages are of free format and variable length allowing for fast response to KEY commands, yet for slower response for lower priority data commands.

An extended message sequence is possible without prolonging system key-up.

The protocol provides for dual stage acknowledge for indication of message receipt and of function successfully completed.

The protocol can handle beginning or trailing status messages in any direction and constant update of current station parameters, such as the current transmitting channel while maintaining data tone muting. Also, advanced diagnostic capability is provided whereby entire station status can be called up by and received by a console for system diagnosis.

Moreover, the function tone decode windows provided are adaptable for various message length to minimize falsing from noise or voice, yet allowing unlimited length signaling.

BRIEF DESCRIPTION OF THE DRAWINGS

FIG. 5 is a graphic representation of the tone and audio signal sent by a console to a base station in a prior art system.

FIG. 6 is a graphic representation including three graphs, of tone and audio signals which can be transmitted from the consoles of the present invention and shows in the third graph, a command signal from a console overriding a test tone being emitted by a base station.

FIG. 7 is a graphic representation, including six graphs, of command signals emitted by a console relative to signals sent from the base station for six different modes of operation of the system of the present invention.

FIG. 8 is a table of the Function Tones that can be utilized by the system of the present invention.

DESCRIPTION OF THE PREFERRED EMBODIMENTS

Figure 1:
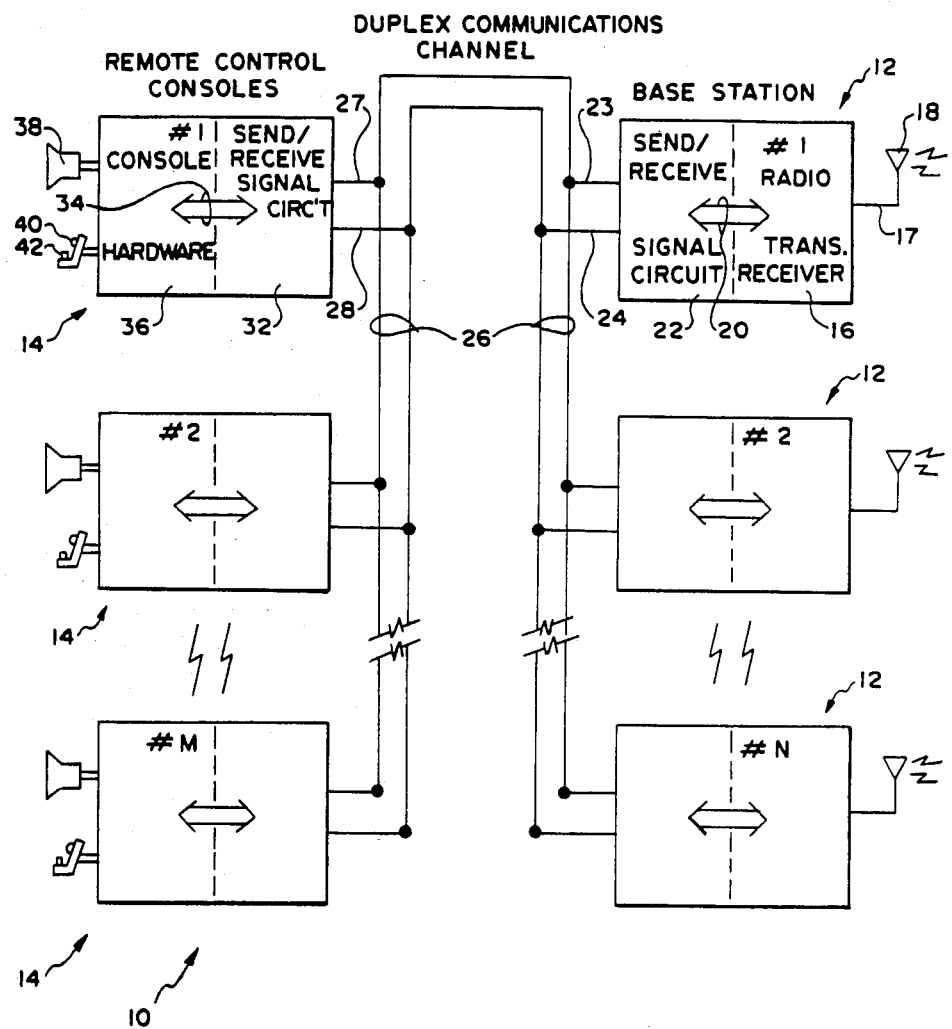
FIG. 1 is a block diagram of a remote control system, having symmetrical voice shared, tone send/receive signaling circuits for coupling one or more of base stations to one or more of remote control consoles for radio communication, constructed according to the teachings of the present invention.

Referring now to FIG. 1, there is illustrated therein a block diagram of the remote control system for radio communications constructed according to the teachings of the present invention. The remote control system is generally identified by reference numeral 10 as shown.

The system 10 includes one or more base stations 12, three of which are shown numbered 1, 2 and N and/or one or more remote control consoles 14 three of which are shown and numbered 1, 2 and M.

Each of the base stations 12 includes conventional radio transmitter and receiver circuitry generally identified by the reference numeral 16. This radio transmitter and receiving circuitry 16 includes an output/input 17 coupled to an antenna 18 and is coupled by multiple lines 20 in the base station 12 to a voice-shared, tone send/receive signaling circuit 22.

The signaling circuit 22 is coupled by two conductors 23,24 to a conventional wire line, or audio channel 26. The wire line 26 is a standard audio communications channel, typically a standard telephone line or so-called "twisted pair" or its equivalent. Other possible channels such as a microwave link, fiber-optic link or a radio relay link can be used in place of the wire line 26. Such wire line 26 must be capable of passing electrical signals over a nominal frequency band width of from 300 Hz to 3000 Hz in a full duplex fashion. The function of the wire line 26 is to electrically connect each base station 12 to all the other base stations 12 and consoles 14 coupled to the wire line 26. Other possible audio channels, such as a 4-wire duplex channel, can be utilized for electrically connecting the stations 12 and consoles 14 in parallel.

As shown, the wire line 26 is connected to a pair of input/output lines 27 and 28 coupled to each console 14. More specifically, the lines 27 and 28 are coupled to a symmetrical, voice-shared, tone send/receive signaling circuit 32 in each console 14. Such signaling circuit 32 is symmetrical and substantially identical to the signaling circuit 22. The signaling circuit 32 is coupled by a plurality of lines 34 to console hardware and associated circuitry 36. This console hardware and associated circuitry 36 interfaces the signaling circuit 32 with a speaker 38, a microphone 40, a microphone activating push button switch 42 and other devices such as control lights.

The base stations 12 including the radio transmitter and receiver 16 is typically situated at a point of high elevation such as on a hill, mountain or the top of a building to provide effective transmission of signals radiated from an elevated height. However, it is generally not desired to have an operator at the site of the transmitter and therefore, the operation of the transmitter/receiver 16 is controlled from a remote control console 14 located, for example, in a police station.

The system 10 of the present invention is particularly adapted for coupling more than one base station 12 to more than one remote control console 14 over a conventional audio channel, such as telephone wire line 26 utilizing tone control signals which are shared by the audio/voice signals on the wire line 26. In this respect, coded tones and audio/voice signals are carried by the wire line 26 from a base station to a remote control console or vice versa. In particular, the wire line 26 couples a remote control console 14 to a base station 12 when the console 14 wishes to communicate, via that base station's transmitter/receiver 16, with a mobile unit, such as a policecar or another system such as utilized by the state police or the sheriff's police.

The system 10 of the present invention is able to provide multiple coupling of base stations 12 and consoles 14 as shown in FIG. 1 by utilizing symmetrical send/receive signaling circuits 22 and 32 and by reason of the programming of microprocessors in the signaling circuits 22 and 32 which in conjunction with operator manual activation, enable communication between one console 14 and a selected other console 14 or base station 12. Additionally, the symmetrical signaling circuits 22 and 32 together with the programmed microprocessor in each circuit 22 or 32 enables an operator of a particular console 14 to gain control of the communication channelwire line 26 for transmitting information, including coded signals and/or audio/voice signals.

Figure 2:
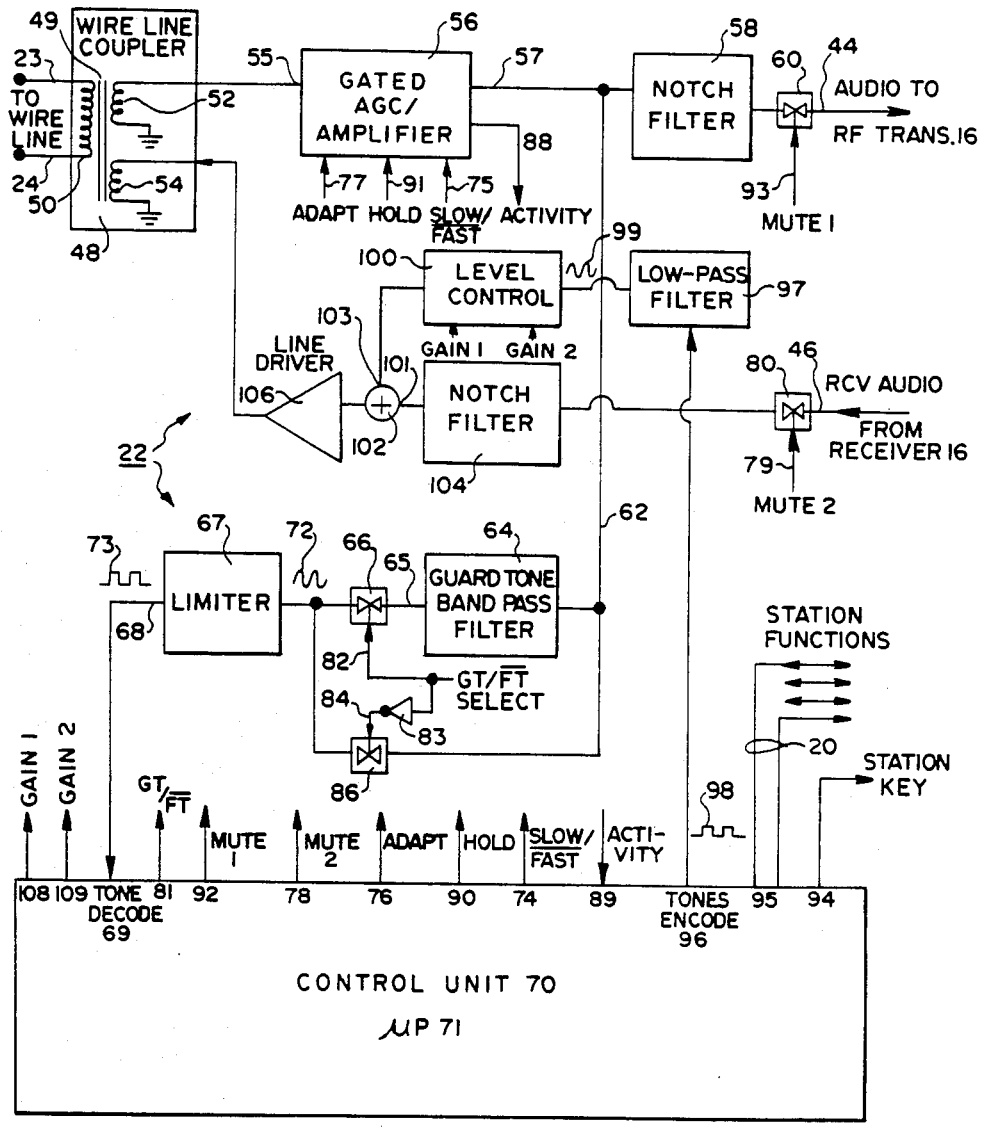
FIG. 2 is a schematic circuit diagram of one symmetrical send/receive signaling circuit of the present invention which is mounted in each base station shown in the block diagram of FIG. 1.

Referring now to FIG. 2, there is illustrated therein, a schematic circuit diagram of the signaling circuit 22 showing the major hardware elements thereof. Here, it will be seen that audio output signals to the radio transmitter/receiver 16 are supplied on an output line 44 and signals that are picked up from the antenna 18 and amplified by the receiver 16 are inputted to the circuit 22 on an input line 46.

It is to be understood that the sending of signals takes preference over the receiving of signals. In this respect, signals sent from a console 14 will include coded tone signals and audio/voice signals and will be received at the input lines 23,24 and supplied to a wire line coupler 48. The coupler 48 includes a transformer 49 having a primary input winding 50, a secondary output winding 52 and a secondary input winding 54 by which signals received from the transmitter 16 are supplied to the wire line 26 as will be described in greater detail hereinafter.

The wire line coupler 48 is a standard coupling transformer 49 commonly used to interface a balanced 600 ohm wire line 26 to an unbalanced signal.

A signal received from a console and supplied to the primary winding 50 is picked up by the secondary winding 52 which functions as a monitor of the wire line 26 for signals thereon and supplies that signal to an input 55 of a gated automatic gain control amplifier, or simply gain control circuit 56, constructed according to the teachings of the present invention. This circuit 56 has an output 57 which is coupled through a Notch Filter 58 and a transmission gate 60 to the radio transmitter 16.

The Notch Filter 58 is an electronic filter whose purpose is to pass all signals except those in the vicinity of a Guard Tone frequency (nominally 2175 Hz). Such a Notch Filter 58 is also known as a Band Reject Filter and is described in National Semiconductor's Linear Data Book, 1982 ed., under application notes for "MF10" IC.

At the same time, the output 57 from the gain control circuit 56 is coupled via a conductor 62 to a Guard Tone band pass filter 64, the output 65 of which is connected to a transmission gate 66 that couples the filter 64 to a limiter 67. An output 68 of the limiter 67 is then input to an input port 69 of a control unit 70 which includes a microprocessor that senses and captures the Guard Tone.

The Guard Tone band pass filter 64 is an electronic filter whose purpose is to pass signals within the vicinity of the Guard Tone frequency (nominally 2175 Hz) while rejecting all other signals. This filter also can be realized by an MF10 filter manufactured by National Semiconductor Corporation but programmed differently than the Notch Filter 58. In this respect, the Notch Filter is of the second order (2 poles) with a nominal frequency of 2175 Hz and a nominal Q of 5.8, whereas the band pass filter 64 is a filter of the fourth order (4 poles) with each second order stage having a frequency of 2175 Hz and a Q of 26.

The limiter 67 is an analog to digital converting circuit which converts an analog input signal 72 to a digital logic signal 73. Such a limiter 67 is commonly known as a zero-crossing detector, a center-slicer, or a one-bit analog to digital converter. Typically, such limiter is realized by an MC3303 hi-gain amplifier or comparator manufactured by Motorola Inc.

The control unit 70 is a digital controller that monitors the operation of the various circuit stages and drives the control inputs to those stages. It is commonly implemented by an eight-bit microprocessor 71 such as the MC6803-1 microprocessor manufactured by Motorola Inc. and includes associated internal or external components such as a clock, a timer, a random access memory, an EPROM, and input/output ports.

The control unit 70 as a whole, has a number of input-/output ports, one of which, input port 69, is a tone decode input port. The use of this port is described in related application Ser. No. 412,628. The other input-/output ports will be described in greater detail below.

In a normal quiescent state, the gated amplifier gain control circuit 56 is in the fast decay mode and a logic low signal from a SLOW/$\overline{FAST}$ output 74 is supplied to a SLOW/$\overline{FAST}$ input 75 of the gain control circuit 56 for placing it in the fast decay mode so it can look for high level Guard Tone. It will be understood that an incoming signal is usually preceded by a high level Guard Tone (HLGT) and this HLGT signal is supplied to the Guard Tone band pass filter 64 and through transmission gate 66 and limiter 67 to the input port 69. Once the microprocessor 71 has sensed that an HLGT has been received, it will send a logic signal from the ADAPT output port 76 to the ADAPT input port 77 of the gain control circuit 56 to place it in an adapt mode so that the gain control circuit 56 can rapidly adjust the gain so that the high level Guard Tone signal amplitude at the output of the gain control circuit 56 (on conductor 62) is at the compression level of the AGC 56 which is nominally 1 volt peak a.c. At the same time, the microprocessor 71 will change a logic high output from a MUTE 2 output port 78 to a logic low output and supply this signal to a control line 79 of a transmission gate 80 in the input line 46 from the radio receiver 16. The transmission gates, such as gates 66 and 80, are normally short circuited when there is a logic high on the control line thereof, such as control line 79, and are normally open circuited when there is a logic low on the control line, such as control line 79. Accordingly, by changing the output at the MUTE 2 output port 78 from a high to a low, signals from the receiver 16 are prevented from passing through the signaling circuit 22 to the wire line coupler 48.

Line 81 (GT/$\overline{FT}$), which is a Guard Tone/not Function Tone control line 81, normally has a logic high thereon that is supplied to a control line 82 of the transmission gate 66 to cause that gate to be short circuited to establish a coupling between filter 64 and limiter 67. It is also supplied to an inverting amplifier 83 which has an output connected to a control line 84 of another transmission gate 86 that short circuits filter 69. When the logic to the inverting amplifier 83 is a logic high, the output is logic low and the transmission gate 86 is open circuited preventing signals from passing therethrough.

After sensing of the HLGT by the control unit 70, the signal level on the output/line/port 81 goes from a high to a low and that open circuits the transmission gate 66 and short circuits the transmission gate 86 so that all Function Tones (FT) (which follow HLGT) can go through the limiter 67 to the control unit 70. In this way, Function Tones which follow after the HLGT are converted from analog signals to digital signals and supplied to the control unit 70 as will be described in greater detail in connection with the description of FIG. 4.

After the first FT signal has been detected by the control unit 70, the control unit 70 outputs a logic low on the SLOW/$\overline{FAST}$ output line 74 to cause the gain control circuit 56 to go into a slow decay mode. It also outputs a logic low on the ADAPT line 76, coupled to input 77 of the gated AGC amplifier 56, which prevents rapid sample-and-hold adjustment of the gain as the input audio level varies.

Audio/voice ACTIVITY sensed is outputted from an output 88 of the gain control circuit 56 to an ACTIVITY input 89 of the control unit 70 to indicate to the control unit 70 that a high amplitude signal (relative to the original HLGT) is on the wire line 26.

A HOLD output port 90 will have a logic high which is inputted to a HOLD input 91 of the gain control circuit 56 if the control unit 70 is encoding an acknowledge tone signal so that the gain control circuit 56 will have the same gain after an acknowledge tone is sent.

Further details of the construction and operation of the gain control circuit 56 in conjunction with the control provided by the control unit 70 will be described in greater detail in connection with the description of FIGS. 9 and 10.

Normally, the control unit 70 has a logic low on a MUTE 1 output line 92 which is connected to a control line 93 for the transmission gate 60 so as to place the transmission gate 60 in an open circuit non-transmitting mode to mute audio outputs on line 44. Once the control unit has deciphered the Guard Tone and then the Function Tone, it will then send an output signal, if instructed to do so, on a station key output line 94 which activates the transmitter to transmit a signal. At the same time, or a short predetermined time period thereafter, the logic signal level on the MUTE 1 output 92 is changed from a low to a high to place the transmission gate 60 in a closed circuit condition. Then, the audio/voice signal received by the gain control circuit 56 is passed through the Notch Filter 58, which filters out the Guard Tone signals, and through the transmission gate 60 to the radio frequency transmitter 16.

Depending upon the Function Tones received and decoded by the control unit 70, various station functions as well as keying of the station/transmitter 16 can be effected by the microprocessor 71. In this respect, a plurality of input/output lines 95 are provided by which inputs from the transmitter/receiver 16 can be supplied to the microprocessor 71 for effecting certain operations.

In this respect, when a signal such as an audio/voice signal from a mobile unit is picked up by the antenna 18 and supplied to the receiver 16, the receiver 16 supplies signals on the station function lines 95 to the control unit 70 to tell it that a signal is coming in from a mobile unit or other unit. The control unit 70 will then generate certain tone codes, as will be described in greater detail hereinafter in connection with the description of FIG. 4, which are outputted on a tone encode output line 96 to a low pass filter 97 which filters digital tone function signal 98 to produce filtered analog signal 99.

The low pass filter 97 is an electronic filter that passes all frequency components below a predetermined cut-off frequency while rejecting those above that frequency. Typically, this filter is a five pole Tschebyshev filter with its nominal cut-off frequency at 2700 Hz.

The analog signal 99 from the low pass filter 97 is then supplied to a level control circuit 100 which is a programmable attenuator that is controlled by two control inputs GAIN 1 and GAIN 2. Based on the logic levels at these two inputs, GAIN 1 and GAIN 2, the level control circuit 100 assumes a GAIN as predetermined by the circuit design. Table 1 below, shows how this is achieved:

TABLE 1

| GAIN 1 | GAIN 2 | SETS GAIN 2: |
|--------|--------|--------------|
| LOW    | LOW    | −30 DB for low-level Guard Tone |
| HIGH   | LOW    | −10 DB for Function Tone |
| LOW    | HIGH   | 0 DB for high-level Guard Tone |
| HIGH   | HIGH   | undefined (not used) |

The gain levels shown in Table 1 above are relative to the peak audio/voice levels that are present at an audio input 101 to an audio mixer stage 102. The mixer stage 102 is also coupled to the output of the level control circuit 100 and simply mixes (algebraically adds) the attenuated coded tones received at an input 103 from the level control circuit 100 and audio signals received at the input 101 from a Notch Filter 104.

While the encoded tones are being supplied to the filter 97 and the level control circuit 100, the signal from the MUTE 2 output port 78 to the control line 79 is still a logic low to maintain the transmission gate 80 open circuited. Once the encoded signals have been outputted from the control unit 70, the signal level from the MUTE 2 output port 78 is changed to a logic high to close circuit the transmission gate 80 and allow the audio/voice signal on the input line 46 to pass through the transmission gate 80 to the Notch Filter 104, which is substantially identical to the Notch Filter 58. The Notch Filter 104 filters out audio energy in the vicinity of the Guard Tone frequency and supplies a filtered audio signal to the input 101 of the mixer stage 102. The output from the mixer stage 102 is then supplied to a line driver 106 which drives winding 54 of wire line coupler 48 to place the encoded tone/audio signal onto the wire line 26.

As shown in FIG. 2, the attenuation by the level control circuit 100 is controlled by the logic levels on the two inputs GAIN 1 and GAIN 2, which logic inputs are supplied from GAIN 1 output port 108 and GAIN 2 output port 109 of the control unit 70.

It will be understood that when the transmission gate 80 is short circuited to receive audio signal from the receiver 16, a control signal to the control line 93 from the MUTE 1 output port 92 will be a logic low and is supplied to the transmission gate 60 to prevent any signals from being sent to the transmitter 16.

Also, the gain control circuit 56 will be in a fast decay mode at this point in time (since the base station is not in a "Line Push-to-Talk" mode). However, if a remote console 14 should output a coded signal, in other words, an HLGT signal, this HLGT signal will be received and modified by the gain control circuit 56 and inputted to the tone decode input port 69 of the control unit 70. Once the control unit 70 receives such an HLGT signal, it will immediately change the logic signal supplied from the MUTE 2 output port 78 to the control line 79 of the transmission gate 80 to open circuit that transmission gate and interrupt the audio transmission from the receiver 16 to the wire line 26. In this way, priority of control of the symmetrical, voice-shared, tone, send-/receive signaling circuit 22 is controlled by a sender of a signal from one of the consoles 14 or base stations 12.

Figure 3:
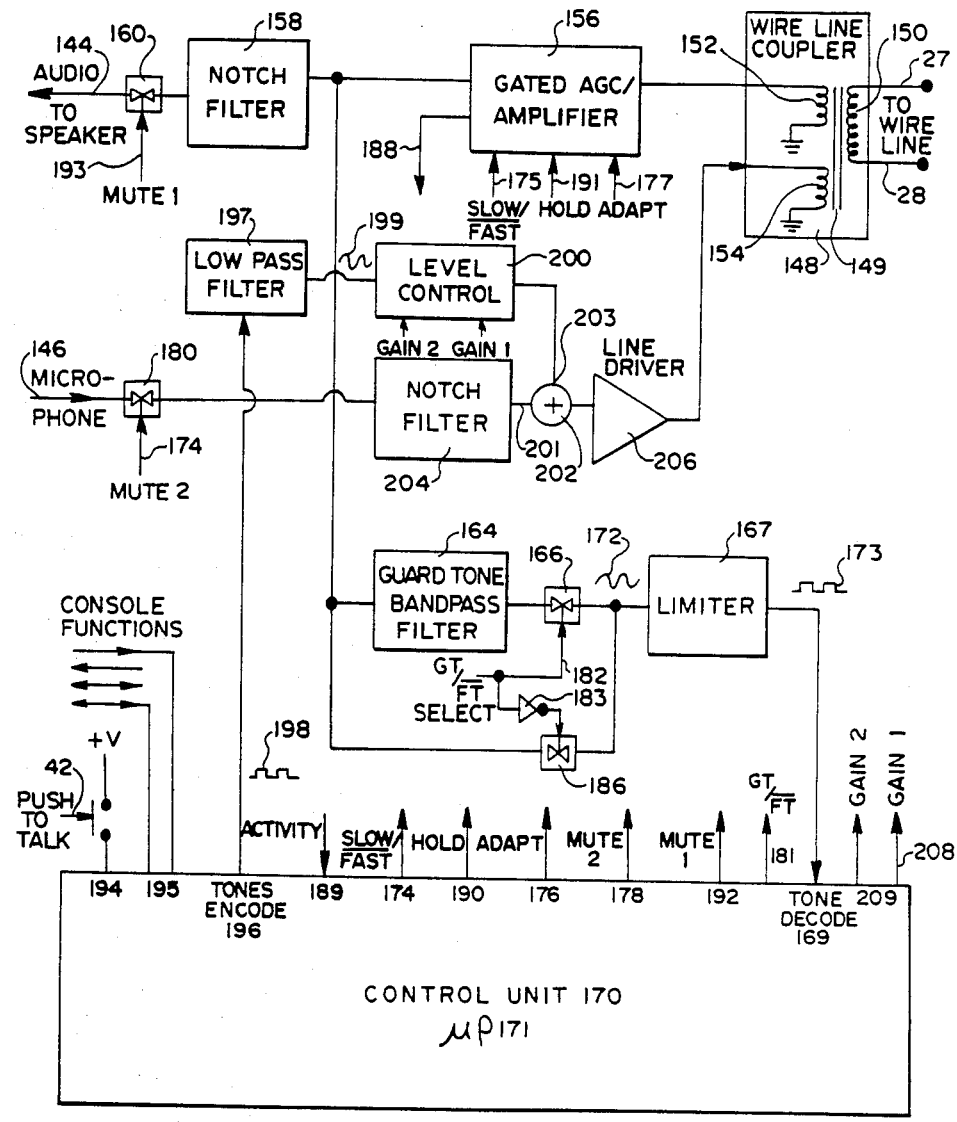
FIG. 3 is a schematic circuit diagram of the other symmetrical send/receive signaling circuit of the present invention which is mounted in each console shown in the block diagram of FIG. 1.

FIG. 3 is a schematic circuit diagram of the symmetrical, voice-shared, tone, send/receive signaling circuit 32. This circuit 32 is called a symmetrical circuit because it is symmetrical to the signaling circuit 22 and vice versa. For all intents and purposes, the circuit 32 is identical to the circuit 22 and the circuit elements of the circuit 32 are identified by reference numerals which are identical to the reference numerals used in FIG. 2 except with the number 100 added to each of them. Accordingly, in the circuit 32, an audio output line 144, similar to the audio output line 44 shown in FIG. 2, supplies an audio signal to the speaker 38 (instead of to antenna 18 as does the line 44).

Then, instead of having an input line 46 from a receiver, the circuit 32 has an input line 146 from the microphone 40. The other circuit elements are identical such as, for example, the wire line coupler 148 is identical to the coupler 48, the gain control circuit 156 is identical to the gain control circuit 56, etc.

The only other difference between the circuit 32 and the circuit 22 is that the plurality of input/output lines 195, substantially identical to the input/output 95 in the circuit 22, are console function lines instead of station function lines. Also, instead of a station keying line 94 which outputs a signal to the transmitter 16, the circuit 32 has a microphone enable input line 194 which is operated by the push button switch 42 to tell the control unit 170 to initiate signaling tones to cause a base station 12 to "key" and then cause the transmission gate 180 to be short circuited. Again, all the circuit elements of the circuit 32 are identical to, or as stated previously symmetrical to, the circuit elements in the circuit 22. This simplifies construction of the base stations 12 and the remote consoles 14 since, except for some connections and programming, the same signaling circuits 22,32 are utilized.

Accordingly, when an encoded tone/audio signal is picked up by the primary winding 150 of coupler 148, it is supplied to the Guard Tone band pass filter 164, converted to a digital signal by the limiter 167, and decoded by the control unit 170. The control unit 170 will then ensure that the control line 179 to the transmission gate 180 has a logic low thereon and after the Guard Tones and Function Tones have been decoded, the logic on the control line 193 is changed to a logic high to close circuit the transmission gate 160 so that the audio signal coming in can be routed to the output line 144 coupled to the speaker 38.

On the other hand, when it is desired to send a message, the operator pushes the button 42 to tell the control unit 170 that he wants to send a message. A Guard Tone and appropriate Function Tones are generated by the control unit 170 and supplied to the secondary winding 154 of the coupler 148 for transmission to the wire line 26. Then, the control unit 70 will cause short circuiting of the transmission gate 180 thereby enabling the audio input from the microphone 90.

In addition to the advantages explained above, the symmetrical circuits 22,32 permit a number of base stations 12 and remote control consoles 14 to be coupled to one wire line 26. Further, by reason of the circuit elements and the programming of the control unit 70 or 170, priority is established by the operator who wishes to take command of the wire line 26, and he does this simply by pressing his button 42 and speaking on his microphone 40. This will be more clearly explained in connection with the description of the protocol for operating the microprocessor 71 or 171 illustrated in Figs. 11A-11D.

Figure 4:
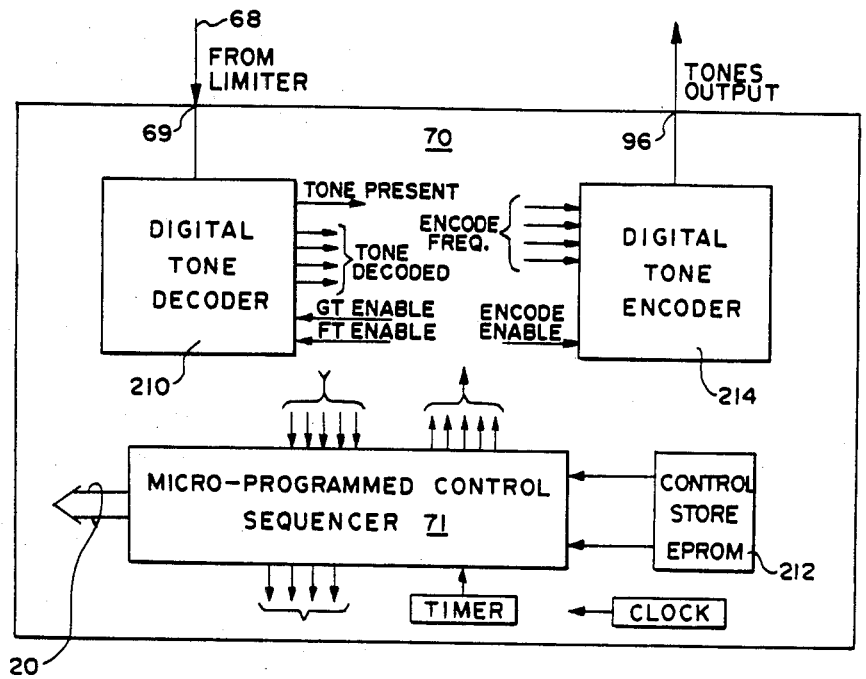
FIG. 4 is a more detailed block schematic circuit diagram of the control unit forming part of each of the circuits shown in FIGS. 2 and 3.

Turning now to FIG. 4, there is illustrated therein, the logic details of the control unit 70, it being understood that the control unit 170 is identical to the control unit 70.

As shown, the control unit 70 includes a digital tone decoder 210 which can be realized by the decoder disclosed in copending application Ser. No. 412,628 filed Aug. 30, 1982 by Arman Dolikian for: MULTIPLE SIMULTANEOUS TONE DECODER, the decoder disclosed in copending application Ser. No. 448,457 filed Dec. 10, 1982 by Arman Dolikian for: GUARD TONE CAPTURE METHOD, or the decoder disclosed in the Cannalte U.S. Pat. No. 3,577,080 for REMOTE CONTROL SYSTEM FOR OPERATION OVER SAME AUDIOCHANNEL PROVIDING VOICE SIGNALS BETWEEN REMOTE STATION AND BASE STATION, the disclosures of which are incorporated herein by reference.

The control unit 70 also includes the microprocessor 71 which is identified as a micro-programmed control sequencer. Connected to the sequencer or microprocessor 71 is an EPROM 212 containing stored control information. For example, information regarding the action which should be taken by a base station 12 when certain function tones are received is stored in the EPROM 212. Likewise, in signaling circuit 32 information regarding which function tones are to be sent out at the command of push buttons on the console 16 are stored in the EPROM 212.

Further, the control unit 70 includes a digital tone encoder 214 which can be of conventional design. The encoder has an ENCODE ENABLE input which when driven high by the sequencer 71 causes the encoder to encode a square wave digital signal which becomes a tone after it is filtered, at the same time the sequencer 71 also sends a binary word to the encoder 214 telling it what frequency to output.

It will be apparent from FIG. 4 that a tone signal from the limiter 67 received at input 69 is supplied to the digital tone decoder 210 which indicates to the processor or sequencer 71 when a tone is present and then decodes the tone and sends the identity of the decoded tone to the sequencer 71.

The sequencer 71 then sends out a station key signal on line 99 and/or station function signals which are the outputs 95 supplied to lines 20.

Other outputs of the sequencer 71 are Guard Tone enable signal, Function Tone enable signal, the encode enable signal and encode frequency signal which are sent to the digital tone encoder 214, when the sequencer 71 is encoding a signal to be sent out with an audio signal. Other inputs of the sequencer 71 are the activity signal in addition to a tone present signal and tone decoded signals.

Other sequencer 71 outputs are the ADAPT signal, the HOLD signal, the SLOW/$\overline{\text{FAST}}$ signal, the MUTE 1 and MUTE 2 signals, the GAIN 1 and GAIN 2 signals and the GT/$\overline{\text{FT}}$ select signal.

FIG. 5 is a graphic illustration of a standard tone and voice or audio signal 220 which is presently utilized in remote control systems for radio communications. This signal has a first portion 221 which is the HLGT signal at a frequency of 2175 Hz and which is programmed to last for 120 milliseconds. Next is an FT signal 222 which can have one or two FT signals. After the FT signal 222, there is an LLGT and voice signal 223. At the end of transmission and before anyone else can use the channel or channels, there is a 150 millisecond dropoff period. Here, base station 12 holds on to the channel for the drop-off period in case there is more voice coming.

In FIG. 6, are illustrated several coded tone/voice signals that can be sent out by a remote console 14 of the system 10. In the first, so-called, "PIGGY-BACK" STATION KEY sequence, it is clear that the first tone is an HLGT signal 225, the second signal is an FT signal 226 followed by an LLGT signal 227. As soon as the LLGT signal 227 (with or without voice) is over or during the LLGT signal 227, the same console or another console can come in on the audio channel (wire line 26) and take command of same. This is shown by the second HLGT signal 228 and the second FT signal 229.

Another feature of the system 10 of the present invention is that any number of multiple Function Tones can be combined and in any sequence. As shown, first an HLGT signal 230 is generated followed by five FT signals 231–235 which are selected from the Function Tones shown in FIG. 8. Such tones or combination thereof indicate certain functions to be performed by another console 14 or by a base station 12. For example, one Frequency Tone can indicate that the STATION key should be actuated. Another tone can indicate what channel or frequency the transmitter 16 is to transmit. Another tone can indicate that lights on the antenna tower are to be turned on or turned off.

Another command comprises an HLGT signal 241 followed by an FT signal 242 which asks the base station 12 to send out a test tone 243. Typically, the test tone 243 is at 1004 Hz and is at the Function Tone level which is −13 decibels. This test tone lasts for 6 seconds or until some other HLGT command signal 245 comes on the wire line 26. Here, the HLGT signal 245 coming on the line 26 causes the test tone 243 to stop. Again, this shows that preference is always given to an HLGT signal coming on the line 26 and this is referred to as a command.

FIG. 7 illustrates Simple Acknowledge Sequence. Here, a command HLGT signal 250 is sent out followed by an FT signal 251. Then, as shown, an acknowledge signal 252 comes back and then an LLGT signal 253 is outputted by the remote console 14. This acknowledge signal can cause the lighting up of a lamp on the console to indicate to the operator that he has gained access and is now taking command of a base station 12 and its transmitter 16.

The next command sequence is a Verified Acknowledge Sequence. Here, the console 14 sends out an HLGT signal 250 and FT signal 251 and the base station, because of some activity going on, cannot acknowledge immediately, so it sends out a variable duration 850 Hz WAIT TONE 256. This WAIT TONE 256 can cause blinking of the lamp on the console 14 to indicate to the operator that he must wait a little while before he can gain access to a base station 12. Then, of course, once the other activity is finished, the base station 12 will send out the acknowledge signal 252 and then the console 14 can start sending out the LLGT signal 253 and voice.

The console 14 can also ask for alarm or status, and this is referred to as the SOLICITED, ALARM or STATUS sequence. Here, the console 14 sends out an HLGT signal 258 and one or more FT signals 259. The base station 12 will then come back with an HLGT signal 260 and one or more FT signals 261-264 to indicate an alarm or status information.

When there is some malfunction at the base station 12 that is sensed by the signaling circuit 22, an unsolicited alarm signal is sent. This signal includes an HLGT signal 266 followed by a number of FT signals 267-270 to indicate to the console what malfunction has occurred at the base station 12.

Next, a leading status message can be sent by a signaling circuit 22 in a base station 12 which message is basically a data message sent as a preamble to the voice that follows rather than just sending the voice itself. For example, the data message which is started with an HLGT signal 271 and followed by several Function Tone (FT) signals 272,273 and 274 can identify what channel the receiver 16 is currently receiving on. Also, in this manner a base station 12 can "key" another base station 12.

A trailing status message from the base station 12 is like a postscript rather than a preamble and provides a data message in addition to voice. Again, such status message includes an HLGT signal 280 and several FT signals 281-283 and can identify what channel the receiver 16 is receiving on or some other message.

In FIG. 8 is set forth a list of the function tones from F0 to F15 and the nominal frequency for each Function Tone. As shown, the first Function Tone F0 is the frequency of high level and low level Guard Tones. The second Function Tone F1 is typically for a minotor function. Typically, the Function Tone F2 is a key tone for keying a station. In other words, this tone emitted from the signaling circuit 22 tells the signaling circuit 22 to emit a signal to turn on the transmitter 16. The Function Tone F3 is typically an alternate keying tone.

Function Tones F4 through F11 are data tones which are translated into binary numbers as shown. F12 is a repeat tone and also an acknowledge tone. In this respect, when you want to repeat certain tones to make up a binary word, instead of repeating the tone, you just emit the Function Tone followed by the tone F12 to indicate that the previous tone should be repeated. This obviates the need for tone detection based on tone duration. F13 is a wait tone and F14 and F15 are not normally used but are available if the user of the system has a special need for them.

With respect to the data tones F4-F11, it will be appreciated that one tone defines a three bit binary word, two tones define a six bit binary word, and three tones define a nine bit word.

Figure 9:
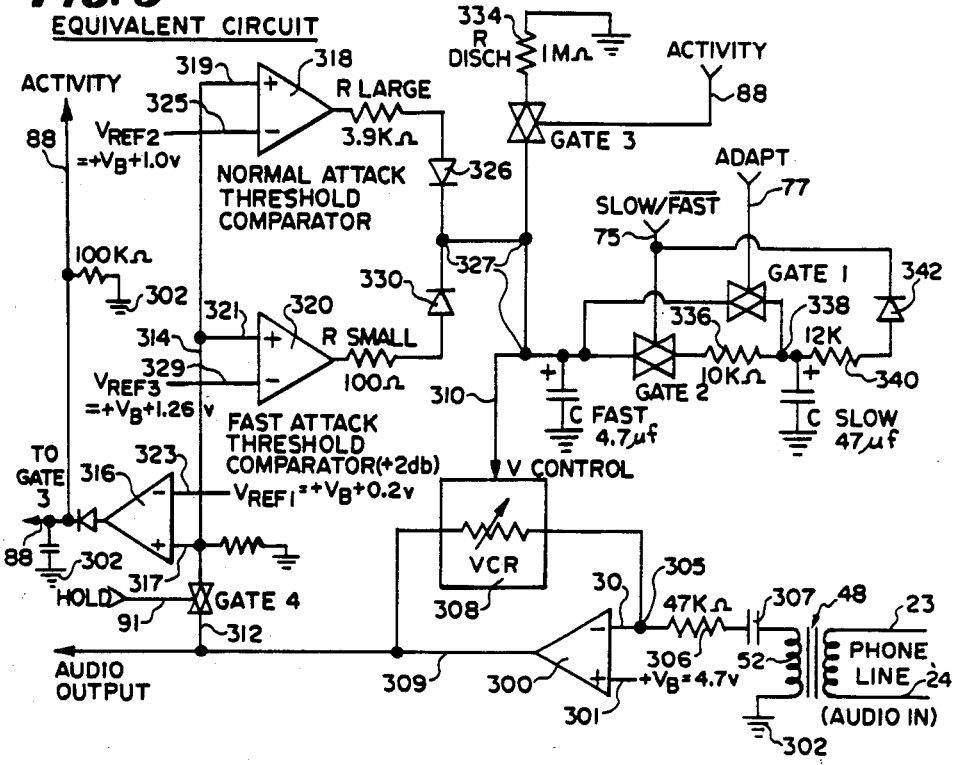
FIG. 9 is a schematic circuit diagram of the automatic gain control circuit utilized in each of the circuits shown in FIGS. 2 and 3.

In FIG. 9 is illustrated a schematic circuit diagram of the equivalent circuit for the gain control circuit 56 or 156. This circuit 56 (it being understood that the circuit 156 is identical thereto) is uniquely adapted for use in the signaling circuits 22 and 32 of the present invention.

Traditionally, automatic gain control circuits are not directly usable in a two-wire tone remote control system such as the system 10 where the stations, consoles or nodes are coupled by a wire line 26, because of the need in such a system to adapt the gain rapidly to the level of an incoming transmit audio signal which may be as much as 30 decibels below the outgoing receiver audio signal. If a push-to-talk button, such as the button 42, were operated to cause immediate transmission following high levels of receiver audio signals, the gain of a traditional automatic gain control circuit would be very low at the beginning of that transmission. This would result in the transmission of audio signals which are inaudible at the beginning of the transmission and gradually increase to full deviation depending upon the automatic gain control circuit decay constants. In other words, it is dependent upon the rate at which the gain increases. Even if the decay time were extremely rapid, there would be a short interval at the beginning of the signal transmission in which the transmitter deviation would be far below normal. Further, such a rapid decay time would produce an annoying "pumping" of the audio signal, increasing in gain rapidly between words. This tradeoff is completely overcome with the gain control circuit 56 in that the gain is set properly for full deviation in the circuit 56 before the operator even speaks and yet the decay time constant can still be made slow enough to prevent "pumping". In addition to a slow decay time constant, the control circuit 56 utilizes a technique for freezing the gain level when no audio signal is present to reduce "pumping" even further.

In a typical FM system in which deviation is restricted to a peak value (of 5 kHz for example), if an automatic gain control circuit is used to maximize deviation, it should adjust its gain based on the audio signal peaks. Therefore, a fast attack time constant (one in which the automatic gain control circuit gain decreases rapidly to attenuate a strong audio signal) is desirable. This fast attack time constant combined with a slow decay rate will produce an audio signal which is peak limited and yet has no noticable "pumping" effect. Although this combination of fast attack/slow decay is optimum for achieving consistent FM deviation, there is a danger of a strong noise burst pushing the automatic gain control circuit gain far below its normal level, possibly reducing the deviation to near zero until the slow decay rate finally restores the gain. This problem also is overcome with the gain control circuit 56 by the provision of a dual time constant that rapidly blanks the noise, then quickly returns the gain to the previously established level. These desirable characteristics of fast attack/slow decay can be used without running the risk of reduced transmitter deviation after a noise burst.

Typically, an automatic gain control circuit uses a voltage-controlled resistance (VCR) as a gain controlling element and places this element in series with a fixed resistor to produce a variable voltage divider. A feedback circuit coupled to the VCR resistance controls the VCR resistance to increase or decrease the attenuation to maintain a constant signal level at the output of the voltage divider. Since only attenuation is possible (i.e. the maximum gain out of the voltage divider is approximately unity), an amplifier must follow the voltage divider with fixed gain equal to the maximum gain required for the smallest input signal. Since this gain is fixed, strong input signals (which do not require as much amplification) would be attenuated, then amplified. This effectively reduces the signal to noise of strong input signals (since a strong input signal is attenuated making it smaller compared to the noise of the amplifier). The gain control circuit 56 achieves a wide dynamic range without producing any signal to noise degradation of the input signal by placing a gain control element in the feedback loop of an inverting operational amplifier, where such gain control element can provide either attenuation or gain as necessary, but never more gain than is required by a particular input signal.

As shown in FIG. 9, the gain control circuit 56 includes an operational amplifier 300 which has a plus input 301 coupled to a bias reference voltage, $V_B=4.7$ v and a minus input 303 coupled to a junction 305 in a voltage divider defined by a fixed resistor 306 coupled, if desired, through a coupling capacitor 307 and through the secondary winding 52 to system ground 302 and a variable voltage control resistor (VCR) 308 which is coupled between the junction 305 and an output 309 of the amplifier 300. Typically, the VCR 308 is realized by a field effect transistor which has a gate or voltage control line 310. In the circuit 56, the gain is determined by the potential at VCR control line 310 of VCR 308 which alters the ratio of resistors 306 and 308 and thus the gain of operational amplifier 300.

The gain control circuit 56 includes four gates which are identified as GATE 1, GATE 2, GATE 3 and GATE 4. These GATES are either in a closed circuit condition or an open circuit condition and such condition is controlled by the outputs from the microprocessor 71 to the control lines for these gates which are as follows: GATE 1 has its control line connected to the ADAPT input line 77. GATE 2 has its control line coupled to the input line to the SLOW/$\overline{\text{FAST}}$ input line 75. GATE 3 has its control line connected to the ACTIVITY input line 88 and GATE 4 has its input line coupled through an inverting amplifier 311 to the HOLD input line 91.

As shown, the output 309 of the amplifier 300 is coupled to the audio output line 57 and to a conductor 312 which is coupled through GATE 4 to a conductor 314 which is connected to the plus input of three comparators 316, 318 and 320, namely plus inputs 317, 319 and 321 of activity comparator 316, normal threshold attack comparator 318 and fast attack threshold comparator 320. The comparator 316 senses activity and has its minus input 323 coupled to a first reference voltage of $V_B + 0.2$ V, where $V_B$ is the bias voltage of 4.7 v. Any time the output of the amplifier 300 is above $V_B + 0.2$ volts, indicating some kind of signal activity input, the activity comparator 316 will have a logic high output which is supplied to the activity output line 88 and fed back to GATE 3 as shown.

The conductor 314 is also coupled, as shown, to the plus input 319 of the normal threshold comparator 318. This comparator 318 has its minus input 325 coupled to a second reference voltage which is $V_B + 1.0$ volts so that any time there is an output (peak voltage) from the amplifier 300 above $V_B + 1$ v the normal threshold comparator 318 supplies an output voltage through a resistor R-LARGE and a diode 326 to a junction 327 which is coupled to the voltage control line or gate 310 of the VCR 308 and to filter/storage capacitor C-FAST.

If the output of the amplifier 300 is above $V_B + 1$ volts, which is considered to be the peak amplitude for normal speech, and also exceeds $V_B + 1.26$ volts, the fast attack threshold amplifier 320 which has $V_B + 1.26$ volts applied to a minus input 320 thereof is activated to output a voltage that is applied through resistor R-SMALL and a diode 330 to the junction 327. As shown, the minus input 320 of the fast attack threshold amplifier 320 is coupled to a third reference voltage which is $V_B + 1.26$ volts. Thus, when the output voltage at the output 309 of the amplifier 300 exceeds $V_B + 1.26$ volts, both comparators 318 and 320 output a current through parallel connected resistors R-LARGE and R-SMALL and this establishes a smaller RC time constant for charging a capacitor C-FAST which is coupled between the junction 327 and system ground 302. The function of the capacitor C-FAST will be described in greater detail hereinafter.

It will be appreciated from the description of the control circuit 56 so far described, that the comparators 318 and 320 form a feedback loop from the output 309 of the amplifier 300 to the control line 310 of the VCR 308 so that the gain controlling potential at the junction 310 can be adjusted to provide the gain desired.

As shown, GATE 3 is coupled between the junction 327 and one side of a discharge resistor 334 which is connected on the other side thereof to system ground 302. The capacitor C-FAST is connected between junction 327 and system ground 302. Also, capacitor C-FAST at junction 327 is connected to one side of GATE 2, the other side of which is connected through a blanking resistor 336 (which is also referred to as R-BLANK) to a junction 338. A second capacitor C-SLOW is coupled between the junction 338 and system ground 302 as shown. This junction 338 is also coupled through a discharging resistor 340 and a diode 342 to the SLOW/$\overline{\text{FAST}}$ line 75.

Further, as shown, GATE 1 is coupled across junction 327 and 338 and when short circuited will create a short across GATE 2 and the blanking resistor 336.

Figure 10:
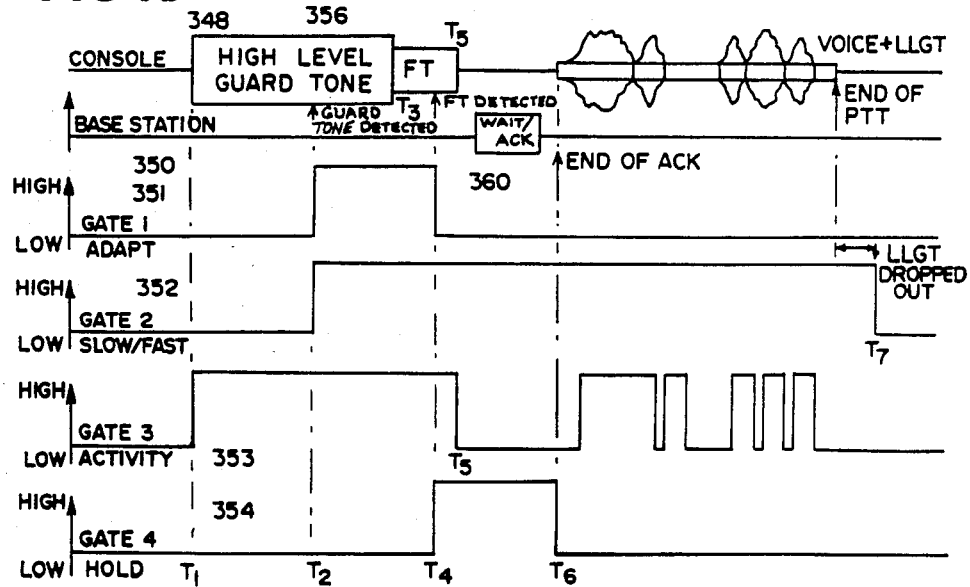
FIG. 10 is a group of five graphs showing the various signal levels at different points and times in the automatic gain control circuit shown in FIG. 9.
Figure 11A:
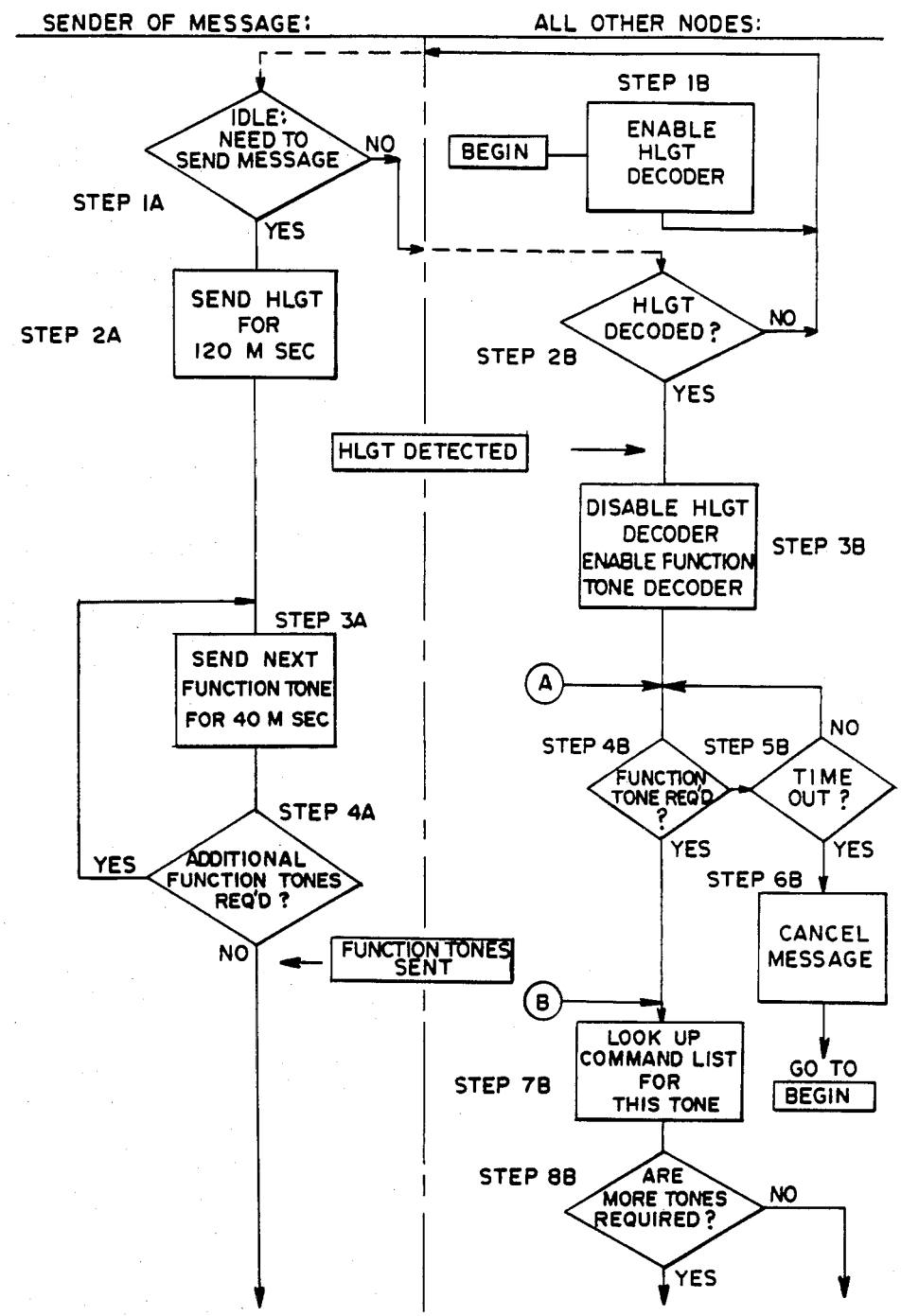
FIGS. 11A–11D together comprise a flow chart of the protocols followed by the microprocessor of the control unit for either sending a message or for receiving a message from any other console or base station with the flow chart or protocol on the left-hand side setting forth the steps followed for sending a message and the flow chart or protocol on the right-hand side showing the steps followed for receiving a message.
Figure 11B:
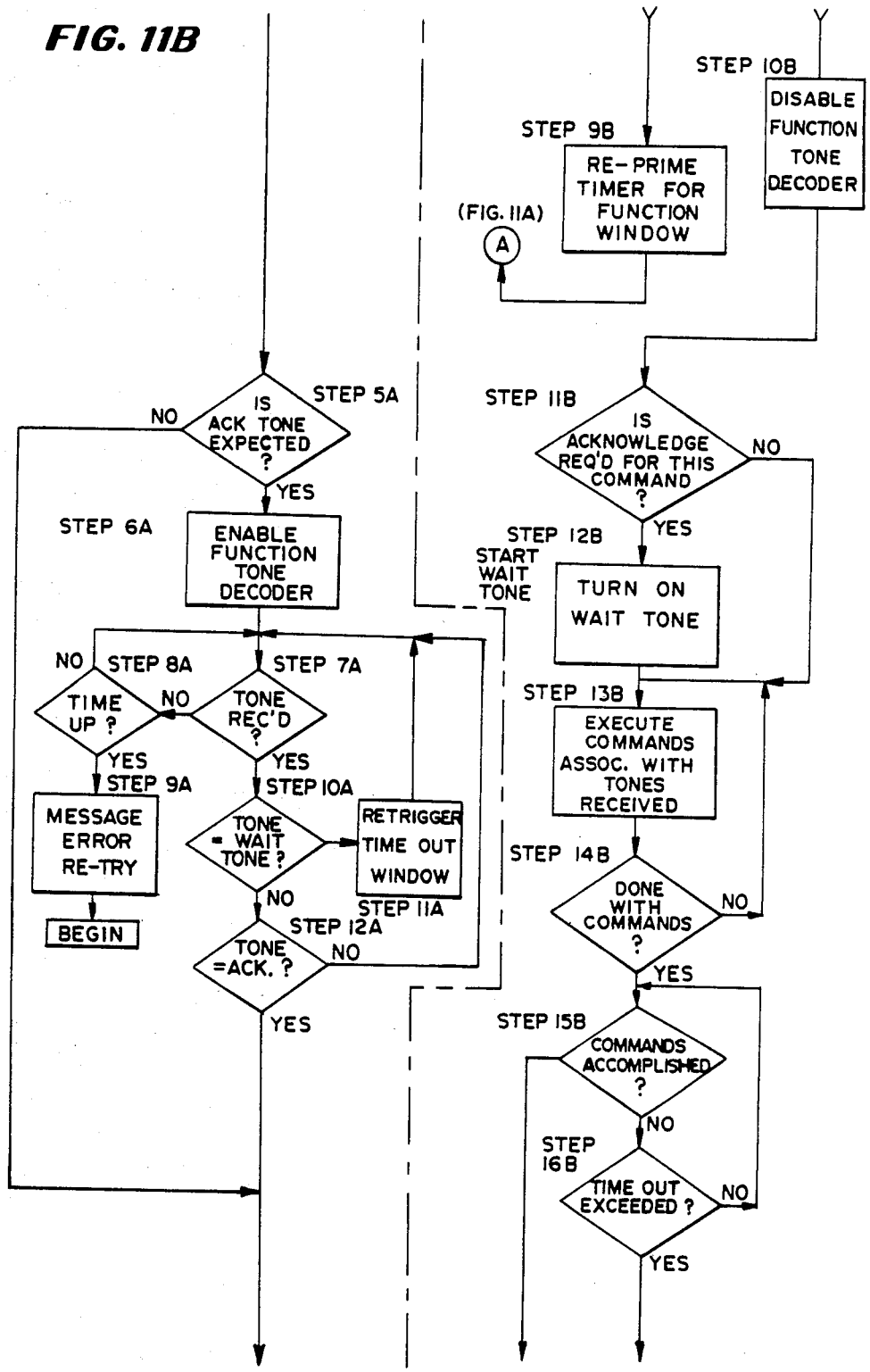
Figure 11C:
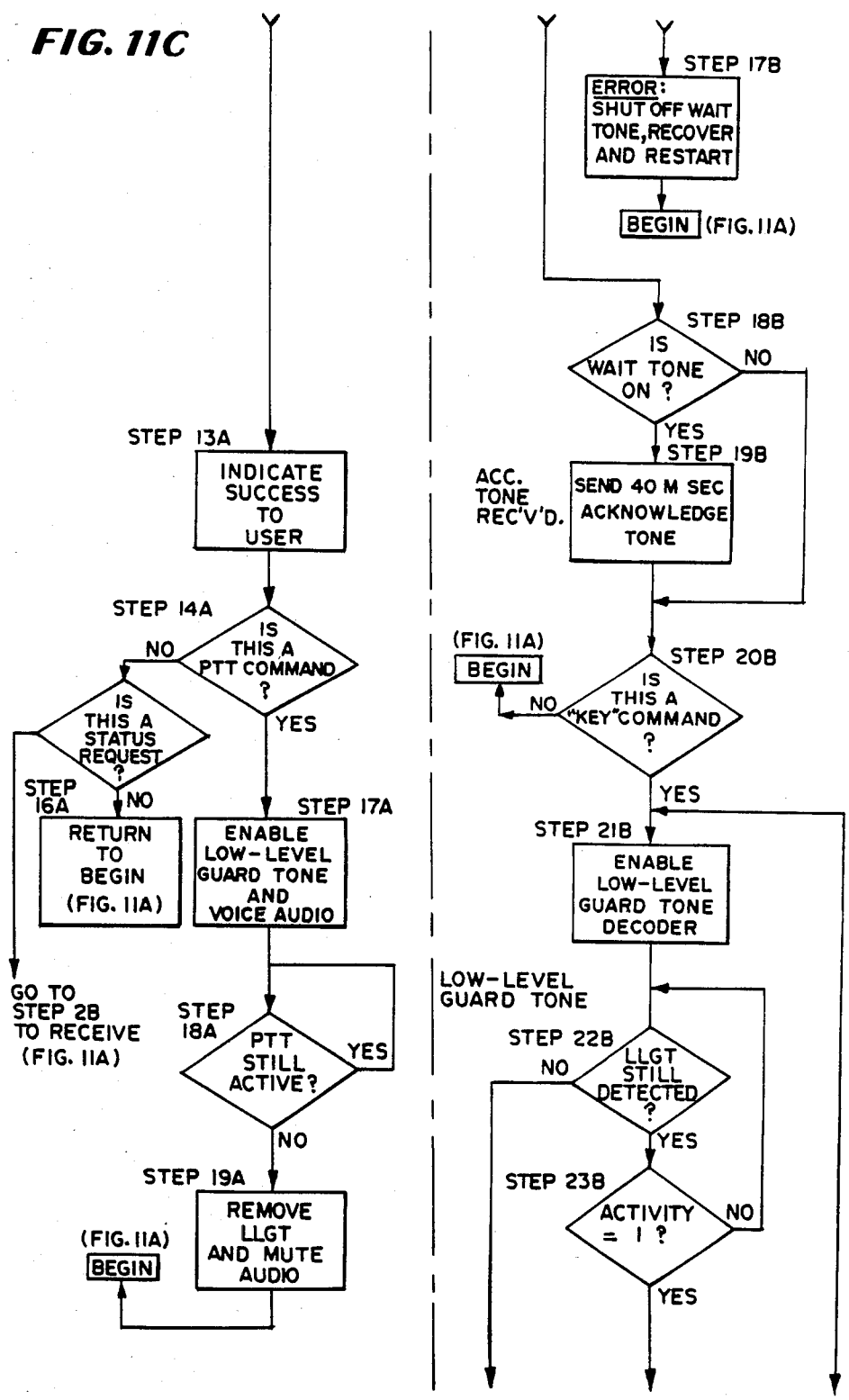
Figure 11D:
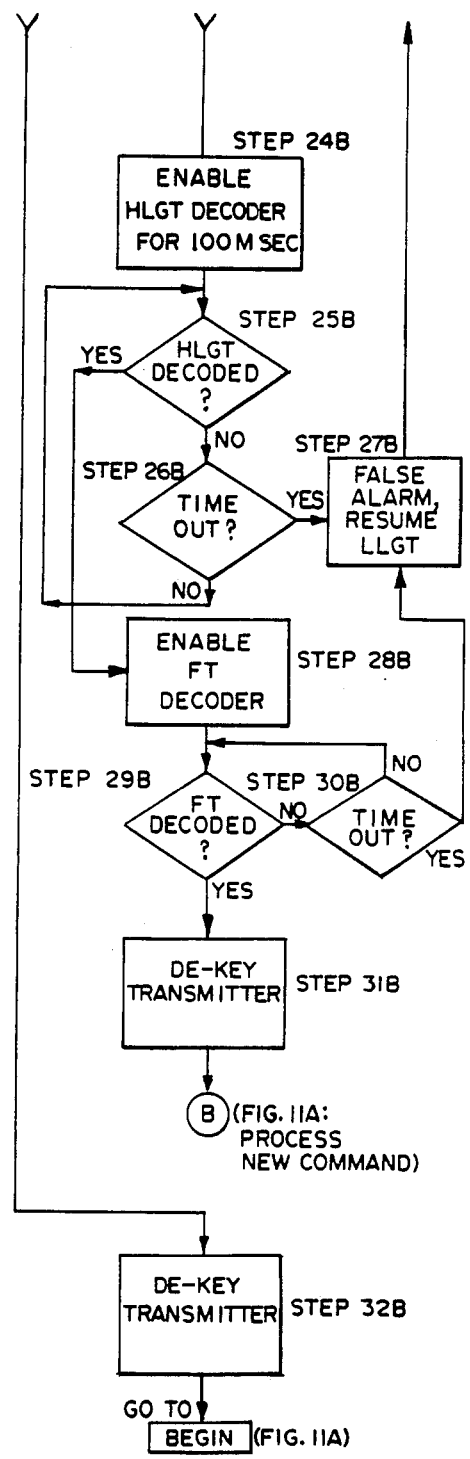

For a better understanding of the operation of the gain control circuit 56, reference is made to the graphs of FIG. 10. Initially, it is assumed that there is no audio signal present either coming from the console or the base station. Also, it is assumed that a signal will be sent from a console 14 to a base station 12 and the gain control circuit 56 is in a base station circuit 22. Accordingly, there initially is no signal from the console 14 as shown by graph 348, and there is no signal from the base station 12 as shown by graph 350. At this point in time, the microprocessor 71 will be outputting a low signal to GATE 1 as shown by graph 351. Similarly, GATE 2 has a FAST or logic low signal thereon as indicated by line 352. This logic low signal disables GATE 2 such that the voltage on the capacitor C-FAST is only affected by the output of the comparators 318 and 320 and not by any charge or lack of charge on the capacitor C-SLOW.

GATE 3 will be at a logic low, since there is no activity, as shown by graph 353. Also, the HOLD signal will be at a logic low or the HOLD disable signal which is converted by the inverting amplifier 311 to a logic high or $\overline{\text{HOLD}}$ signal which causes GATE 4 to be short circuited. This signal is indicated by graph 354 in FIG. 10.

There are three basic modes of operation of the automatic gain control circuit 56 which are known as the fast decay mode, the slow decay mode and the adapt mode. In the standby quiesent stage shown by the graphs 348–354 between time $T_0$ and $T_1$ the circuit 56 is in the fast decay mode and this is when the signaling circuit 22 is in standby, looking for a high level guard tone from a remote control console 14.

It is possible that an audio signal from the receiver 16 also might be present, usually at a much higher level than an incoming high level guard tone signal (often between 10 and 30 decibels higher).

The function of the gain control circuit 56 at this point in time is to reduce the gain ahead of the guard tone band pass filter 64 as necessary to prevent saturation of the filter 64, since the guard tone would not be detectable if the guard tone band pass filter 64 were in a clip state.

Now when a high level guard tone comes in, as indicated by reference numeral 356 in FIG. 10, and is picked up by the winding 52 the output from the activity amplifier 316 immediately goes from low to high and supplies an activity signal at the output 88.

Meanwhile, the control unit 70, and more particularly the microprocessor 71, is determining that a high level guard tone is present and when it determines that a guard tone is present at time $T_2$ it sends an ADAPT (logic high) signal and a SLOW (logic high) signal to the ADAPT input 77 and the SLOW/FAST input 75 of the gain control circuit 56 to close circuit GATE 1 and GATE 2. It is to be noted that the high level guard tone is usually at the same level as the level of peak voice signal which will follow, or slightly lower.

It is important to note here that in the standby or quesient state, the logic level on the input line 75 is low so that any charge on the capacitor C-SLOW can discharge through the resistor 340 and the diode 342. Then when the logic level of line 75 is changed from a low to a high, charging of the capacitor C-SLOW is enabled. Then when the signal on the ADAPT input 77 is changed from a low to a high at time $T_2$, capacitor C-FAST is connected in parallel with capacitor C-SLOW. Since the capacitance of capacitor C-SLOW is much larger than the capacitance of capacitor C-FAST and since capacitor C-SLOW had been previously discharged, the voltage across the parallel combination of capacitor C-SLOW and C-FAST is near zero, causing a low voltage to be supplied to the control input line 310 of the VCR 308 to place maximum resistance into the divider circuit formed by VCR 308 and 306 to provide maximum gain. Within typically 15-20 milliseconds the parallel combination of capacitor C-SLOW and C-FAST is charged to a voltage which reduces the resistance of the VCR 308 to a value which causes the appropriate amount of gain or attenuation required to hold the peak high-level guard tone amplitude measured at the output 309 of amplifier 300 and supplied to output line 57 at the compression point of the gain control circuit 56 nominally 1 v peak a.c. The gain control circuit 56 has thus "adapted" to the level of the high-level guard tone 356. Then when the function tone has been detected at $T_4$, if the command is a line-push to talk signal, GATE 1 will be open circuited or turned off leaving only GATE 2 short circuited. This places the gain control circuit 56 in a slow-decay/noise-blanking mode for the duration of the transmission.

Once the microprocessor 71 has deciphered the function tones and determined that a voice signal is coming in to be transmitted by the signaling circuit 22, if the microprocessor 71 is to send an ACKNOWLEDGE tone, then microprocessor 71 changes the output from the HOLD output from a low to a high and this high is inverted by the inverting amplifier 311 to a logic low which causes the GATE 4 to be open circuited which causes the feedback circuit comprising the comparators 318 and 320 to be disconnected from the circuit 56. As a result the activity comparator 316 is disconnected from the circuit so that the charge on the capacitors C-FAST and C-SLOW is held relatively constant. This is because the discharge path through the large discharge resistor 324 is open circuited. Without discharge and without feedback, the voltage at junction 327 is kept relatively constant and the resulting gain is kept relatively constant. This logic high HOLD signal is held until a wait/acknowledge signal 360 from the base station 12 is sent out to the console 14.

Then after the acknowledge signal sent by the control unit 70 ends, the microprocessor 71 changes the logic level on the HOLD input 91 from a high to a low at time $T_6$.

As shown by the graph 353 in FIG. 10 of the activity output signal which starts out as a logic low, when there is a voice signal, such as a word, the output of the activity amplifier goes high to place the discharge resistor 334 in series with the capacitor C-FAST and C-SLOW so that they are discharged slowly, thus gradually increasing the gain of amplifier 300.

In the slow-decay/noise-blanking mode, noise-blanking is achieved as follows. When a high-amplitude short duration noise burst comes into the circuit 56, this will cause the capacitor C-FAST to be rapidly charged by the voltage output from the comparators 318 and 320 through parallel connected resistors R-LARGE and R-SMALL. Rapid charging of the capacitor C-FAST will increase the voltage on the line 310 to lower the gain of the control circuit 56 to reduce the audio level at output 309 to within 2 decibels above the compression point. However, because of the slow time constant of the resistance 336, R-BLANK, and the capacitor C-SLOW, the voltage on the capacitor C-SLOW will not change appreciably. Then after the noise burst has ended, since the capacitance of the capacitor C-SLOW is much greater than that of the capacitor C-FAST, the voltage on the capacitor C-FAST will rapidly return to the voltage stored on the capacitor C-SLOW which is very nearly the voltage that was on capacitor C-SLOW at the beginning of the noise burst. Thus, the gain of the circuit 56 returns to the value which had been established by the transmitted audio signal before the noise burst.

In the meantime with GATE 3 close circuited, a slow discharge path for capacitor C-FAST and capacitor C-SLOW is provided through the discharge resistor 334. This allows the gain of the gain control circuit 56 to slowly track the audio level of the signal when speech is present but freezes the gain during pauses in the speech.

In order to achieve rapid attack times required for adapting and for noise-blanking and yet maintain a desired characteristic of the gain control circuit 56, two different attack rates are employed. Under normal conditions an attack rate optimized for audio quality is employed with the normal attack threshold comparator 318. This normal attack is brought about by the charging of the capacitor C-FAST through the R-LARGE resistor. However, during the adapt mode, or noise-blanking mode, the normal attack rate provided by the comparator 318 is usually not fast enough to be effective and the output of the gain control circuit 56 would rise above the normal compression point. However, when the amplitude of the output of the gain control circuit 56 is two decibels or more above the normal compression point, the fast attack comparator 320 is triggered which causes the resistor R-SMALL to be connected in parallel with the resistor R-LARGE such that the capacitor C-FAST is then charged through a smaller resistance (faster RC time constant). This provides an extremely rapid attack (gain reduction) rate by the application of a high charging current to capacitor C-FAST (and in the case of the adapt mode to capacitor C-SLOW as well).

After the end of the voice and LLGT signal transmission the microprocessor 71 will sense the lack of low level guard tone, and once this is sensed at time $T_7$ the microprocessor 71 changes the SLOW/FAST output from a high to a low so that the gain control circuit 56 is returned to the standby or rapid decay mode. This low on input line 75 also results in the discharge of capacitor C-SLOW.

The gain control circuit 56 (and, of course, the symmetrical identical circuit 156) provides a number of advantages over prior gain control circuits used, not only in remote control systems for radio communications, but also in gain control circuits in general. In this respect, the gain control circuit 56 provides the following advantages:

1. Noise is blanked and suppressed in a manner which allows the gain control circuit 56 to immediately return to the previously established gain setting. This is provided in the slow decay mode with the combination of capacitors C-FAST and C-SLOW and resistor 336 (R-BLANK).

2. A wide dynamic range is provided without any degradation of the input signal to noise ratio beyond what would occur in an optimally adjusted fixed gain amplifier. This is achieved by locating the gain-control VCR (or FET) in the feedback loop of amplifier 300.

3. The gain of the circuit 56 is held constant for low input signal levels such as pauses between spoken words to prevent "pumping" of the gain thereby to produce audio quality as good as with any fixed gain amplifier which is optimally adjusted. This is obtained principally through the activity detector 316, GATE 3 and discharge resistor R 334. The slow discharge time constant is allowable because of the rapid adapt feature.

4. The circuit 56 provides for rapid adaptation to the level of the incoming high level guard tone. This is achieved principally through the provision of the capacitors C-FAST and C-SLOW, and the control gates GATE 1 and GATE 2, and their control by the ADAPT input 77 and the SLOW/$\overline{\text{FAST}}$ input 75 from control unit 70. With these circuit elements and control inputs, the gain is automatically adjusted at the beginning of each signal transmission regardless of whether a signal at a much higher level, such as a receiver audio signal, had been on the same wire line 26 immediately before the beginning of the signal transmission. This rapid adjustment to the proper level is what makes it possible to use the automatic gain control circuit 56 in the signaling circuits 22 and 32 without sacrificing audio quality or transmitter deviation level.

5. With the gain control circuit 56, the transmit audio signal level is automatically adjusted at the beginning of each line-push-to-talk transmission (depressions of button switch 42) and there is never any need to periodically adjust the transmitter audio input gain to make up for seasonal variations in wire line 26 losses.

6. With the control circuit 56 in conjunction with the control unit 70, all adjustments and programming are made at the factory and adjustments are rarely necessary upon installation. Accordingly, there is no need to adjust the transmitter line audio input gain during installation of the system 10.

7. With each signaling circuit 22 and 32 having its own gain control circuit 56 or 156, multiple remote control consoles 14 can be coupled to a common wire line 26 at various distances away from one or more base stations 12 and each console 14 and each base station 12 is able to automatically adjust for full deviation at the beginning of a transmission regardless of the level of the audio signal reaching a base station 12.

Referring now to FIGS. 11A–11D, there is illustrated therein flow charts of the protocol A followed by the program in the microprocessor 71 when a sender of a message depresses the push button switch 42 and any other control button switches on the console 14 for sending a message, STEPS 1A–19A, and of the protocol B followed when a control unit 70 or 170 senses that a message signal is being received, STEPS 1B–31B. Although the protocols A and B are described below for signaling circuit 22 it is to be understood that the same protocols are carried out in signaling circuit 32 also.

Although the protocol A for sending a message is set forth on the left hand side of FIGS. 11A–11D in numbered STEPS 1A–19A, and the protocol B for receiving a message is set forth on the right hand side of FIGS. 11A–11D in STEPS 1B–31B, it is to be noted that there is a looping or polling between the two protocols A and B at the beginning of any receive or send protocol.

Also, when a message is being sent this message can be received by not only base stations 12 but also by other consoles 14 and the combined group of base stations 12 and consoles 14 coupled to the wire line 26 are referred to as "ALL OTHER NODES" for the protocol B.

The entry point into the protocols A and B, whether it be for sending a message or receiving a message, starts at BEGIN in protocol B. This entry point is entered at the power up of the system 10 and also at the completion of a signaling sequence.

STEP 1B. In this step, the signaling hardware is initialized in preparation for detecting a future incoming HLGT signal. This initializing of various signal levels in the signaling circuit 22 or 32 is as follows:

| Automatic gain control circuit 56: | |
|---|---|
| ADAPT input 77 or 177 = | Logic Low |
| HOLD input 91 or 191 = | Logic Low |
| SLOW/$\overline{\text{FAST}}$ input 75 or 175 = | Logic Low (Fast) |
| Audio Lines 44 & 46 or 144 & 146: | |
| MUTE 1 input line 93 or 193 = | Logic Low (Disable Transmit Audio) |
| MUTE 2 input line 79 or 179 = | Logic High (Enable Receiver Audio) |
| Encoder 214: | |
| ENCODE ENABLE = | Logic Low (Disable Encoder) |
| GAIN 1 and GAIN 2 (108 and 109) = | Undefined since no tones being encoded |
| FREQUENCY = | Undefined since no tones being encoded |
| Decoder 210: | |
| FILTER SELECT (GT/$\overline{\text{FT}}$ output 81 = or 181) | Logic High |
| GT ENABLE = | Logic High (ON) |
| FT ENABLE = | Logic Low (OFF) |

In the following description only changes of these logic states will be described.

From here, the message receive protocol B goes to the message send protocol A in STEP 1A.

STEP 1A. At this step, the microprocessor 71 or 171 senses external conditions that would warrant a message being sent out on the wire line 26. In this respect, a remote control console 14 may want to send the following messages: STATION KEY MESSAGE followed by voice to send out a message over the transmitter receiver 16, STATION CHANNEL CHANGE, STATION FUNCTION COMMAND, STATION STATUS INTERROGATION, etc. A base station 12 may want to send out an UNSOLICITED ALARM MESSAGE, LEADING OR TRAILING STATUS MESSAGE, etc. If it is determined that a message is to be sent, the protocol A then follows the send protocol flow chart shown on the left hand side of FIGS. 11A-11D and goes on to STEP 2A. If it is determined that no message is to be sent, the protocol goes back to the receive message protocol and to STEP 2B.

STEP 2B. Here, the processor 71 or 171 determines whether or not an HLGT signal has been decoded. If not, it cycles back to STEP 1A and then, if no message is being sent, back to STEP 2B. This cycling, or polling, continues until the processor 71 senses that a message is to be sent or that a message is being received and needs to be decoded.

STEP 2A. If it is determined that a message needs to be sent, such as the sensing of the depression of the push button switch 42 and other command button switches on the console 14, the processor 71 sends an HLGT signal for 120 milliseconds. Here it will be assumed that the message is being sent from a console 12. Also, at this time the following control signals are initialized:

| AGC 156: | |
|---|---|
| HOLD input 191 = | Logic High |
| Audio lines 144 & 146: | |
| MUTE 1 input 192 = | Logic Low (Disable Speaker Audio) |
| MUTE 2 input 179 = | Logic Low (Disable Microphone Audio) |
| Encoder 214: | |
| ENCODE ENABLE = | Logic High (Enable Encoder) |
| GAIN 1 = | Logic Low (set gain for HLGT) |
| GAIN 2 = | Logic High |
| FREQUENCY = | F0 for HLGT signal (See FIG. 8) |

After these commands have been performed, protocol A goes to STEP 3A.

STEP 3A. Here the first desired function tone is sent for 40 milliseconds. While such desired function tone is encoded onto the wire line 26 for the duration of 40 milliseconds, the encoder is set as follows:

| GAIN 1 = | Logic High |
|---|---|
| GAIN 2 = | Logic Low (for function tones) |
| FREQUENCY = | Fx (where x equals 1 to 15 - see FIG. 8) |

STEP 4A. Here the protocol A determines whether or not additional function tones are required and if they are the protocol loops back to STEP 3A as shown. If not, the protocol proceeds to STEP 5A.

STEP 5A. In STEP 5A, the protocol A decides whether or not an acknowledge tone is expected. If not, the protocol goes ahead to STEP 13A. If the acknowedge tone is expected which is usually the case, the protocol goes on to STEP 6A.

STEP 6A. Here the function tone decoder 210 is enabled and the following logic levels are established:

| AGC 156: | |
|---|---|
| ADAPT input 177 = | Logic High |
| HOLD input 191 = | Logic Low |
| Encoder 214: | |
| ENCODE ENABLE = | Logic Low (Disable Encoder) |
| Decoder 210: | |
| FILTER SELECT = | Logic Low (FT) |
| (GT/$\overline{FT}$ output 181) | |
| GT ENABLE = | Logic Low (OFF) |
| FT ENABLE = | Logic High (ON) |

The timer is set to time out in 60 milliseconds.

STEP 7A. In STEP 7A the protocol A determines whether or not a tone has been received. If not, it goes to STEP 8A and if a tone has been received it goes on to STEP 10A.

STEP 8A. Here the protocol determines whether or not the timer has timed out the time period of 60 milliseconds set up for completing the receipt of tones. If no, the protocol A loops back to STEP 7A. If yes, it goes on to STEP 9A.

STEP 9A. Here a message can be signaled to the operator to indicate that there was a message error and the operator should retry. The signaling hardware 36 will handle any error reporting to the user such as by lighting or blinking a lamp so that the user can try to send the message again or the control unit 70 can automatically retry N times.

STEP 10A. If a tone has been received, the protocol A determines if it was a wait tone. If it is not a wait tone, the protocol goes on to STEP 11A and if it is a wait tone, the protocol goes on to STEP 12A.

STEP 11A. In STEP 11A, the timer is reset to time out for the time period which is typically 60 milliseconds and the protocol goes back to STEP 7A to wait for an acknowledge tone.

STEP 12A. In STEP 12A the protocol determines whether or not the tone was an acknowledge tone. If it was not an acknowledge tone and it had been previously determined it was not a wait tone, the protocol cycles back to STEP 7A to see what happened. If the tone was an acknowledge tone, the protocol goes on to STEP 13A.

STEP 13A. At STEP 13A the protocol indicates to the console hardware 36 that a successful handshaking or connection with another node, such as a base station 12, has been effected. This is usually achieved by causing a lamp to light up on the console.

At the same time the station functions at the base station 12 are updated based on the message received or there is an updated display on another operator's console 14 to signify message received or a function accomplished.

STEP 14A. Here the protocol A determines whether or not there has been a PTT command which is a push-to-talk command. If yes, the protocol goes on to STEP 17A. If not, the protocol goes on to STEP 15A.

STEP 15A. Here the protocol determines whether or not the command was a status request. If yes, the protocol goes to STEP 2B to receive. If the answer is no, it goes on to STEP 16A.

STEP 16A. Here the protocol returns to BEGIN in FIG. 11A.

STEP 17A. If the command was a push-to-talk command, at this step the low level guard tone is enabled and the voice audio is enabled. The signal levels established are as follows:

| Audio lines 144 and 146: | |
|---|---|
| MUTE 1 input 193 = | Logic Low (to disable the transmit audio to the speaker 38) |
| MUTE 2 input 179 = | Logic High (to enable voice to be input on line 146 from the microphone 40 to the audio transmission circuit comprising Notch Filter 204 and line driver 206) |
| Encoder 210: | |
| ENCODE ENABLE = | Logic High (ON) |
| GAIN 1 and GAIN 2 = | Logic Low, Low (LLGT) |
| FREQUENCY = | F0 (LLGT) |

STEP 18A. At STEP 18A if the push-to-talk transmission is still active, the protocol will loop back to the input on STEP 18A until it determines that there is no more need to key the station (operator released push button switch 42) and then goes to STEP 19A.

STEP 19A. At STEP 19A the protocol removes the LLGT signal and/or voice signal being output. Also, the protocol removes the LLGT signal and mutes the audio output signal, i.e., places a logic low on MUTE 2 input 179. All of these actions are usually accomplished by merely going back to BEGIN in FIG. 11A.

At this time the same console 14 or another console can immediately take control of the wire line 26. In other words, a high priority message can be sent by the sending console by using the decoder 210 high level guard tone capture feature simply by sending a message anytime after the LLGT signal has dropped out.

If after cycling through STEP 1B, 1A and 2B an HLGT signal is sensed and decoded the protocol B takes over and goes to STEP 3B. Here it will be assumed that a base station 12 has received the signal at the wire line 26 input to the signaling circuit 22.

STEP 3B. Here the protocol B prepares to decode the function tones and the following logic level states are established:

| AGC 56: | |
|---|---|
| ADAPT input 77 = | Logic High |
| HOLD input 91 = | Logic Low |
| SLOW/FAST = | Logic HIGH (Slow) |
| Audio lines 44 and 46: | |
| MUTE 2 input 79 = | Logic Low (Disable Receiver Audio) |
| Decoder 210: | |
| FILTER SELECT (output line 81) = | Logic Low (FT) |
| GT ENABLE = | Logic Low (OFF) |
| FT ENABLE = | Logic High (ON) |

The timer is set to time out in 60 milliseconds.

STEP 4B. Here the protocol B determines whether or not a function tone is received. If no, the protocol goes to STEP 5B. If yes, it goes on to STEP 7B.

STEP 5B. Here the protocol determines if the timer has timed out 60 milliseconds. If no, the protocol cycles back to STEP 4B. If yes, the protocol goes to STEP 6B.

STEP 6B. Here the protocol cancels the message and goes to BEGIN. In other words, the protocol B determines that an incomplete message was received and goes back to BEGIN to cause the function of disabling the function tone decoder, to enable the guard tone decoder, and to enable the receiver audio.

STEP 7B. Here the protocol B looks up a command list for the function tone received. This is stored in EPROM 212 and serves to customize system operation for specific installations.

STEP 8B. At STEP 8B, the protocol determines whether more tones are required. If no, the protocol goes on to STEP 10B. If yes, the protocol goes on to STEP 9B.

STEP 9B. At this step, the protocol reprimes the timer for sensing the next function tone and after that has been achieved the protocol loops on cycles back to STEP 4B.

STEP 10B. When all function tones have been received, at STEP 10B the function tone decoder 214 is disabled and the FT enable logic state is set to logic low (OFF).

STEP 11B. At this step, the protocol determines whether or not an acknowledge signal is required for this command. If the answer is no, the protocol goes to STEP 13B. If the answer is yes, the protocol goes to STEP 12B.

STEP 12B. At STEP 12B, the microprocessor 71 turns on the wait tone and the following logic levels are established:

| AGC 56: | |
|---|---|
| HOLD input 91 = | Logic High |
| Audio lines 44 and 46: | |
| MUTE 1 input 93 = | Logic Low (Disable Transmit Audio) |
| MUTE 2 input 79 = | Logic Low (Disable Receiver Audio) |
| Encoder 214: | |
| ENCODE ENABLE = | Logic High (Enable Encoder 214) |
| GAIN 1 and GAIN 2 = | High, Low (Function tone) |
| FREQUENCY = | F13 (850 Hz) |
| Decoder 210: | |
| FT ENABLE = | Logic Low (OFF) |

STEP 13B. At this step, the protocol executes the commands associated with the function tones received. This interfaces with the station hardware and circuitry 16 (or console hardware and circuitry 36) to cause the command to be performed.

STEP 14B. Here the protocol determines whether or not the commands have been completed. The timer is set to time out in 500 milliseconds. If the commands are not finished, the protocol cycles back to STEP 13B. If they are completed, they go on to STEP 15B.

STEP 15B. Here the protocol determines whether all the commands that were initiated have been completed or accomplished. If yes, the protocol goes on to STEP 18B. If not, it goes to STEP 16B.

STEP 16B. Here the protocol determines whether or not the time period of 500 milliseconds has timed out. If no, the protocol loops or cycles back to STEP 15B. If yes, it goes on to STEP 17B.

STEP 17B. Here the protocol determines that there is an error and shuts off the wait tone, recovers and restarts. Going back to BEGIN effectively accomplishes these actions. From STEP 17B the protocol will go back to BEGIN in FIG. 11A.

STEP 18B. At STEP 18B the protocol determines whether or not a wait tone is on. If no, it goes on to STEP 20B. If yes, it goes on to STEP 19B.

STEP 19B. At STEP 19B the signaling circuit 22 sends a 40 millisecond acknowledge tone back to a signaling circuit 32 in a console 14. Here the encoder frequency is set to equal F12 (950 Hz).

STEP 20B. Here the protocol determines whether the command was a key command to energize the station key output line 94 to turn on the transmitter 16. If the answer is no, the protocol goes back to BEGIN in FIG. 11A. If the answer is yes, the protocol goes on to STEP 21B.

STEP 21B. Here the low level guard tone decoder is enabled and the logic level states are adjusted as follows:

| AGC 56: | |
|---|---|
| ADAPT input 77 = | Logic Low |
| HOLD input 91 = | Logic Low |
| SLOW/FAST = | Logic High (Slow) |
| Audio lines 44 and 46: | |
| MUTE 1 input 93 = | Logic High (to enable transmit audio) |
| Encoder 214: | |
| ENCODE ENABLE = | Logic Low (Disable Encoder) |
| Decoder 210: | |
| FILTER SELECT (output 81) = | Logic High (GT) |
| GT ENABLE = | Logic High (ON) |
| FT ENABLE = | Logic Low (OFF) |

STEP 22B. Here the protocol determines whether an LLGT signal is still being detected. If no, the protocol goes to STEP 32B. If yes, it goes on to STEP 23B.

STEP 23B. Here the protocol determines whether the activity output is at a logic 1 or not. If no, it cycles back to STEP 22B to see if there is an LLGT signal. If yes, it proceeds to STEP 24B.

STEP 24B. Here the protocol enables the HLGT signal decoder for 100 milliseconds and, in the control unit 70 the following signal levels are established:

| Decoder 210: | |
|---|---|
| FILTER SELECT (output 81) = | Logic High (GT) |
| GT ENABLE = | Logic High (ON) |

Timer is set to time out in 100 milliseconds.

STEP 25B. Here the protocol determines whether or not the HLGT signal has been decoded. If yes, protocol goes on to STEP 28B. If no, it goes to STEP 26B.

STEP 26B. Here the protocol determines whether the timer has timed out the 100 milliseconds. If no, the protocol loops back to STEP 25B. If yes, the protocol goes to STEP 27B.

STEP 27B. At STEP 27B, the protocol determines that there has been a false alarm and goes back to STEP 21B to resume the LLGT signal.

STEP 28B. Here if the high level GT signal has been decoded, the protocol then enables the function tone decoder by setting the following logic levels:

| Decoder 210: | |
|---|---|
| FILTER SELECT (output 81) = | Logic Low (FT) |
| GT ENABLE = | Low (OFF) |
| FT ENABLE = | Logic High (ON) |

The timer is set to time out in 60 milliseconds.

STEP 29B. Here the protocol determines whether or not the function tone has been decoded. If not, it goes on to STEP 30B. If yes, it goes on to STEP 31B.

STEP 30B. Here the protocol determines whether or not the 60 milliseconds has timed out. If no, the protocol loops back to STEP 29B. If yes, it goes on to STEP 27B to indicate a false alarm and from there it goes to STEP 21B to resume the LLGT signal.

STEP 31B. If the function tone has been decoded at STEP 31B, the transmitter is dekeyed and the protocol goes back to STEP 7B to process a new command.

STEP 32B. After all the commands have been completed, the protocol goes from STEP 15B to STEP 32B. Here the transmitter is dekeyed as in STEP 31B and the protocol goes back to BEGIN in FIG. 11A.

From the foregoing description, it will be apparent that the system 10, the signaling circuits 22 and 32 thereof, and the automatic gain control circuit 56 and 156 in each of the signaling circuits 22 and 32, provide a number of advantages, some of which have been described above, and others of which are inherent in the invention. Some of these advantages are as follows:

The system 10 is constructed and operated so that a single wire line 26 can be utilized for both tone and audio signals thus obviating the need for additional wire lines.

The signaling circuits 22 and 32 enable direct communication between two base stations 12, two consoles 14 or one base station 12 and one console 14 or between one station 12 or console 14 with one or more stations 12 and/or one or more consoles 14.

The remote control system 10 using gated audio tone sequential signaling for controlling, from one or more control consoles 14, the operation of another console 14 or one or more base stations 12, permits enhanced data signaling from a console 14 to a base station 12 utilizing variable length data sequences in a prioritized message structure to maximize the performance of the system 10.

The system 10 with tone decoding windows can adapt to variable-length, incoming, signaling messages thereby minimizing falsing from noise or voice thereby providing high system reliability of the system 10.

The system 10 enables a multi-stage acknowledgement for command functions and status thereby providing high system reliability.

In the system 10 and the protocol for operating same, voice messages can be interchanged with concatenated data information tags to identify a particular status condition.

With the protocol illustrated in FIGS. 11A–11D interrogation of any or all stations can be made to obtain knowledge of their status without the necessity of asserting a change of function command.

By using one wire line 26 and symmetrical signaling circuits 22 and 32, all stations are on a common audio path and remain in sync with each other and are knowledgable of the status of all other nodes (stations 12 or consoles 14).

The system 10 enables unsolicited data message initiation from any node (station 12 or console 14) on the wire line 26.

The sequence control of muting of the audio lines 44 and 46 or 144 and 146 eliminates operator annoyance from hearing signaling tones and provides muting durations that adapt to variable signaling times.

Since the system 10 enables any console 14, and for that matter any base station 12, to interrupt a console in the process of transmitting voice in the event of a high priority alarm condition, a preference or priority is provided.

Finally, by enabling the outputting of any number of function tones, the system 10 enables any particular console 14 to select or deselect any particular base station 12 or other console 14.

Also, from the foregoing description, it will be apparent that modificiations can be made to the system 10, to the signaling circuits 22 and 32 thereof, or to the automatic gain control circuit 56 or 156, without departing from the teachings of the invention. Accordingly, the scope of the invention is only to be limited as necessitated by the accompanying claims.

We claim:

1. For use in a remote control system for radio communications, a voice shared, tone coded send/receive signaling circuit comprising audio channel coupling means for sending first voice signals and tone coded signals to and for receiving second voice signals and tone coded signals from an audio channel coupled thereto; gain control and signal coupling means for coupling said second voice signals of said audio channel coupling means to an audio output line and said second tone coded signals to a control means, said gain control and signal coupling means further comprising an operational amplifier, a voltage controlled resistor coupled between a first input and an output of said operational amplifier, a fixed resistor coupled between said audio channel coupling means and said first input of said amplifier, and a second input of said amplifier being coupled to a reference voltage whereby the ratio of said two resistors controls the gain of said gain control means; and audio signal transmission means having an input coupled to an audio input line for said first voice signals, an input coupled to said control means for said first tone coded signals, a combiner for said first voice and tone coded signals, and an output coupled to said audio channel coupling means.

2. The signaling circuit of claim 1 including a feedback loop coupled between the output of said operational amplifier and a voltage control line input to said voltage controlled resistor said feedback loop including at least one threshold comparator.

3. The signaling circuit of claim 2 wherein said feedback loop includes a normal attack threshold comparator and a fast attack threshold comparator each having their plus inputs coupled to the output of said operational amplifier and having their outputs coupled to said voltage control line, and said fast attack threshold comparator having a higher reference voltage coupled to its minus input than does said normal attack threshold comparator.

4. The signaling circuit of claim 3 wherein the output of said normal attack threshold comparator is connected through a large resistance and a diode to said voltage control line.

5. The signaling circuit of claim 3 where said fast attack threshold comparator has its output coupled through a small resistance and a diode to said voltage control line.

6. The signaling circuit of claim 2 including a fast charging capacitor coupled between system ground and said voltage control line.

7. The signaling circuit of claim 6 including a slow charging capacitor and a blanking resistor, said blanking resistor coupling a positive terminal of said slow charging capacitor to said voltage control line, a negative terminal of said slow charging capacitor being connected to system ground.

8. The signaling circuit of claim 7 including a transmission gate between said fast charging capacitor and said blanking resistor and a control line of said transmission gate being coupled to a SLOW/$\overline{FAST}$ control output from said control means whereby said control means can place said gain control circuit means in a slow decay mode or a fast decay mode.

9. The signaling circuit of claim 8 including a short circuit line with a second transmission gate therein connected across said blanking resistor, and an ADAPT control output of said control means being coupled to a control line of said transmission gate whereby said control means can place said gain control circuit means in an adapt mode by closing said second transmission gate and directly coupling said slow charging capacitor to said fast charging capacitor.

10. The signaling circuit of claim 6 including a discharge resistor coupled between system ground and said voltage control line.

11. The signaling circuit of claim 10 wherein said control means include means responsive to signal activity for connecting or disconnecting said discharge resistance to said voltage control line.

12. The signaling circuit of claim 2 including a transmission gate in said feedback loop, and said control means includes a HOLD output coupled to a control line of said transmission gate whereby said control means can temporarily hold the gain of said gain control means by open circuiting said transmission gate.

13. In an automatic gain control circuit comprising an operational amplifier, the improvement comprising:
 a voltage controlled resistor coupled between a minus input and the output of said operational amplifier;
 a fixed resistor coupled between a signal source and said minus input of said amplifier;
 a reference voltage $V_B$ coupled to a plus input of said amplifier whereby the ratio of said two resistors controls the gain of the automatic gain control circuits; and
 a feedback loop, including a normal attack threshold comparator and a fast attack threshold comparator, coupled between the output of said operational amplifier and a voltage control line input to said voltage controlled resistor, said normal attack threshold comparator and said fast attack threshold comparator each having their plus inputs coupled to the output of said operational amplifier and having their outputs coupled to said voltage control line, and said fast attack threshold comparator having a higher reference voltage coupled to its minus input than does said normal attack threshold comparator.

14. The gain control circuit of claim 13 wherein the output of said normal attack threshold comparator is connected through a large resistance and a diode to said voltage control line.

15. The gain control circuit of claim 13 where said fast attack threshold comparator has its output coupled through a small resistance and a diode to said voltage control line.

16. The gain control circuit of claim 13 including a fast charging capacitor coupled between system ground and said voltage control line.

17. The gain control circuit of claim 16 including a slow charging capacitor and a coupling resistor, said coupling resistor coupling a positive terminal of said slow charging capacitor to said voltage control line, a negative terminal of said slow charging capacitor being connected to system ground.

18. The gain control circuit of claim 17 including a transmission gate between said fast charging capacitor and said coupling resistor, and control means for opening or closing said transmission gate to place said gain control circuit means in a slow decay mode or a fast decay mode.

19. The gain control circuit of claim 18 including a short circuit line with a second transmission gate therein connected across said coupling resistor, and control means coupled to a control line of said second transmission gate for closing said gate to place said gain control circuit means in an adapt mode where said slow charging capacitor is directly coupled to said fast charging capacitor.

20. The gain control circuit of claim 16 including a discharge resistor coupled between system ground and said voltage control line.

21. The gain control circuit of claim 20 including control means responsive to signal activity for connecting or disconnecting said discharge resistance to said voltage control line.

22. The gain control circuit of claim 13 including a transmission gate in said feedback loop, and control means coupled to a control line of said transmission gate whereby said control means can temporarily hold the gain of said gain control circuit by open circuiting said transmission gate.

23. A gain controlled remote control system employing a voice shared, tone coded send/receive signaling circuit for control of two-way radio communications, the gain controlled remote control system comprising:
audio channel coupling means for sending first voice and first tone coded signals to and for receiving second voice and second tone coded signals from an audio channel coupled thereto;
signal coupling means for coupling said second voice signals to an audio output line and for coupling said second tone coded signals to a controller means;
gain control means having an input coupled to said signal coupling means an output coupled to said controller means and said audio output line, for maintaining said second voice signals and said second tone coded signals within a range of signal levels by controlling a signal level adjustment factor at a first rate of attack adjustment when a signal at said gain control means input exceeds a first predetermined value and at a second rate of attack adjustment when a signal at said gain control means input exceeds a second predetermined value greater than said first predetermined value; and
audio signal transmission means having an input coupled to an audio input line for said first voice signals, the input coupled to said controller means for said first tone coded signals, a combiner for combining said first voice and said first tone coded signals, and an output coupled to said audio channel coupling means.

24. A gain controlled remote control system in accordance with claim 23 wherein said gain control means further comprises means for controlling said signal level adjustment factor at a first rate of decay adjustment when a logic signal from said controller means is at a first binary level and at a second rate of decay adjustment when said logic level from said controller means is at a second binary level.

25. A gain controlled remote control system in accordance with claim 24 further comprising means for detecting said second voice signal and for maintaining said first rate of decay adjustment in response thereto.

26. A gain controlled remote control system in accordance with claim 23 further comprising means for detecting at least one said second tone coded signal and for adapting said signal level adjustment factor first to said second rate of attack then to said first rate of attack in response to said second tone coded signal detection.

* * * * *

UNITED STATES PATENT AND TRADEMARK OFFICE
CERTIFICATE OF CORRECTION

PATENT NO. : 4,627,098

DATED : Dec. 2, 1986

INVENTOR(S) : Arman V. Dolikian, Michael D. Kotzin, Brian J. Budnik

It is certified that error appears in the above-identified patent and that said Letters Patent is hereby corrected as shown below:

Column 30, line 6, "an output" should be --and an output--.

Column 30, line 18, "the input" should be --an input--.

Signed and Sealed this

Seventeenth Day of March, 1987

Attest:

DONALD J. QUIGG

Attesting Officer    Commissioner of Patents and Trademarks